(12) United States Patent
Oh et al.

(10) Patent No.: US 12,249,557 B2
(45) Date of Patent: Mar. 11, 2025

(54) SEMICONDUCTOR DEVICE INCLUDING BACKSIDE WIRING STRUCTURE WITH SUPER VIA

(71) Applicant: Samsung Electronics Co., Ltd., Suwon-si (KR)

(72) Inventors: Seung Ha Oh, Seoul (KR); Kwang Jin Moon, Hwaseong-si (KR); Ho-Jin Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 500 days.

(21) Appl. No.: 17/581,084

(22) Filed: Jan. 21, 2022

(65) Prior Publication Data

US 2022/0384311 A1    Dec. 1, 2022

(30) Foreign Application Priority Data

Jun. 1, 2021   (KR) ........................ 10-2021-0070672

(51) Int. Cl.
| | |
|---|---|
| *H01L 23/48* | (2006.01) |
| *H01L 21/768* | (2006.01) |
| *H01L 21/8234* | (2006.01) |
| *H01L 23/50* | (2006.01) |
| *H01L 23/522* | (2006.01) |
| *H01L 23/528* | (2006.01) |
| *H01L 23/535* | (2006.01) |
| *H01L 23/538* | (2006.01) |
| *H01L 27/088* | (2006.01) |

(52) U.S. Cl.
CPC ...... *H01L 23/481* (2013.01); *H01L 21/76898* (2013.01)

(58) Field of Classification Search
CPC ............ H01L 23/481; H01L 21/76898; H01L 21/823475; H01L 23/5226; H01L 23/5286; H01L 23/535; H01L 27/088; H01L 27/0886; H01L 23/5384; H01L 23/5386; H01L 23/50

See application file for complete search history.

(56) References Cited

U.S. PATENT DOCUMENTS

| | | |
|---|---|---|
| 9,331,062 B1 | 5/2016 | Lane et al. |
| 10,020,254 B1 | 7/2018 | Bao et al. |
| 10,700,207 B2 | 6/2020 | Chen et al. |
| 10,784,198 B2 | 9/2020 | Sengupta et al. |

(Continued)

FOREIGN PATENT DOCUMENTS

| | | |
|---|---|---|
| EP | 3324436 B1 | 8/2020 |
| KR | 20200135151 A | 12/2020 |

*Primary Examiner* — Herve-Louis Y Assouman
(74) *Attorney, Agent, or Firm* — Myers Bigel, P.A.

(57) ABSTRACT

A semiconductor device comprises a substrate that including a frontside comprising an active region and a backside opposite to the frontside, an electronic element on the active region, a frontside wiring structure electrically connected to the electronic element on the frontside of the substrate, and a backside wiring structure electrically connected to the electronic element on the backside of the substrate. The backside wiring structure includes a plurality of backside wiring patterns sequentially stacked on the backside of the substrate, and a super via pattern that intersects and extends through at least one layer of the plurality of backside wiring patterns.

20 Claims, 30 Drawing Sheets

(56) References Cited

U.S. PATENT DOCUMENTS

| | | | |
|---|---|---|---|
| 2014/0065802 A1* | 3/2014 | Chang | H01L 27/1211 |
| | | | 438/479 |
| 2015/0021784 A1* | 1/2015 | Lin | H01L 25/0657 |
| | | | 438/459 |
| 2016/0056292 A1* | 2/2016 | Ho | H01L 21/324 |
| | | | 438/283 |
| 2017/0053834 A1* | 2/2017 | Basker | H01L 21/845 |
| 2019/0198426 A1* | 6/2019 | Choi | H01L 21/3212 |
| 2020/0373331 A1 | 11/2020 | Kim et al. | |
| 2021/0028112 A1* | 1/2021 | Kim | H01L 29/41791 |

\* cited by examiner

SEMICONDUCTOR DEVICE INCLUDING BACKSIDE WIRING STRUCTURE WITH SUPER VIA

CROSS-REFERENCE TO RELATED APPLICATION

This application claims priority from Korean Patent Application No. 10-2021-0070672 filed on Jun. 1, 2021 in the Korean Intellectual Property Office, and all the benefits accruing therefrom under 35 U.S.C. 119, the contents of which in its entirety are herein incorporated by reference.

FIELD

The present invention relates to a semiconductor device and a method for fabricating the same. More specifically, the present invention relates to a semiconductor device including a backside wiring pattern and a method for fabricating the same.

BACKGROUND

Semiconductor devices may be an important factor in the electronic industry due to characteristics such as miniaturization, multi-functionality and/or low fabricating cost. Semiconductor devices may be classified as semiconductor memory devices that store data, semiconductor logical devices that perform arithmetic processing of data, and hybrid semiconductor devices that include memory elements and logical elements, and the like.

As the electronic industry develops, demand for improved characteristics of semiconductor devices is increasing. For example, there may be increasing demand for high reliability, high speed, and/or multi-functionality semiconductor devices. In order to satisfy such demand, the structures inside semiconductor devices may become more complicated and highly integrated.

SUMMARY

Aspects of the present invention provide a semiconductor device in which a PPA (Power, Performance, Area) is improved.

Aspects of the present invention also provide a method for fabricating a semiconductor device in which a PPA is improved.

According to some aspects of the present inventive concept, a semiconductor device comprises a substrate including a frontside including an active region, and a backside opposite to the frontside; an electronic element on the active region; a frontside wiring structure electrically connected to the electronic element, on the frontside of the substrate; and a backside wiring structure electrically connected to the electronic element, on the backside of the substrate, wherein the backside wiring structure includes a plurality of backside wiring patterns sequentially stacked on the backside of the substrate, and a super via pattern that intersects at least a part of and extends through at least one layer of the plurality of backside wiring patterns.

According to some aspects of the present inventive concept, a semiconductor device comprises a substrate that includes a first region and a second region; a first active region and a second active region that are spaced apart by a first distance in the first region; a third active region and a fourth active region that are spaced apart by a second distance smaller than the first distance in the second region; a first transistor on the first active region; a second transistor on the third active region an interlayer insulating film on the first transistor and the second transistor on an upper side of the substrate; a frontside wiring structure electrically connected to the first transistor and the second transistor on an upper side of the interlayer insulating film; a first power wiring electrically connected to the first transistor, between the first active region and the second active region; a second power wiring electrically connected to the second transistor, between the third active region and the fourth active region; and a backside wiring structure on a lower side of the substrate, wherein the backside wiring structure includes a super via pattern electrically connected to the first power wiring, and a backside via pattern electrically connected to the second power wiring, and a height of the super via pattern is more than 1.5 times a height of the backside via pattern along a height direction between the upper and lower sides of the substrate.

According to some aspects of the present inventive concept a semiconductor device comprises a substrate; an active pattern that extends in a first direction, on an upper side of the substrate; a gate structure that extends in a second direction intersecting the first direction, on the active pattern; a source/drain region in the active pattern on a side of the gate structure; an interlayer insulating film on the active pattern, the gate structure and the source/drain region; a power wiring electrically connected to the source/drain region, on an upper side of the interlayer insulating film; a plurality of backside inter-wiring insulating films sequentially stacked on a lower side of the substrate; a super via pattern that penetrates the plurality of backside inter-wiring insulating films; and a through via that penetrates the substrate and the interlayer insulating film and electrically connects the power wiring and the super via pattern.

According to some aspects of the present inventive concept, a semiconductor device comprises a substrate that includes an active region defined by an element separation trench; an active pattern that extends in a first direction, on an upper side of the active region; a gate structure that extends in a second direction intersecting the first direction, on the active pattern; a source/drain region in the active pattern on a side of the gate structure; a power wiring electrically connected to the source/drain region, in the element separation trench; a plurality of backside inter-wiring insulating films sequentially stacked on a lower side of the substrate; a super via pattern that penetrates the plurality of backside inter-wiring insulating films; and a through via that penetrates the substrate and electrically connects the power wiring and the super via pattern.

According to some aspects of the present inventive concept, a method for fabricating a semiconductor device includes providing a substrate that includes a frontside including an active region, and a backside opposite to the frontside; forming an electronic element on the active region; forming a frontside wiring structure electrically connected to the electronic element, on the frontside of the substrate; and forming a backside wiring structure electrically connected to the electronic element, on the backside of the substrate, wherein the backside wiring structure includes a plurality of backside wiring patterns sequentially stacked on the backside of the substrate, and a super via pattern that intersects at least a part of and extends through at least one layer of the plurality of backside wiring patterns.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF EMBODIMENTS

Although terms such as first and second are used herein to describe various elements and components, such elements and components are not limited by these terms. Such terms are used to merely distinguish a single element or component from other elements or components. Therefore, a first element or component described below may be a second element or component within the technical idea of the present invention. When an element or layer is referred to as being "directly" on or contacting another element or layer, no intervening elements or layers are present.

Hereinafter, a semiconductor device according to exemplary embodiments will be described referring to FIGS. 1 to 18.

Figure 1:
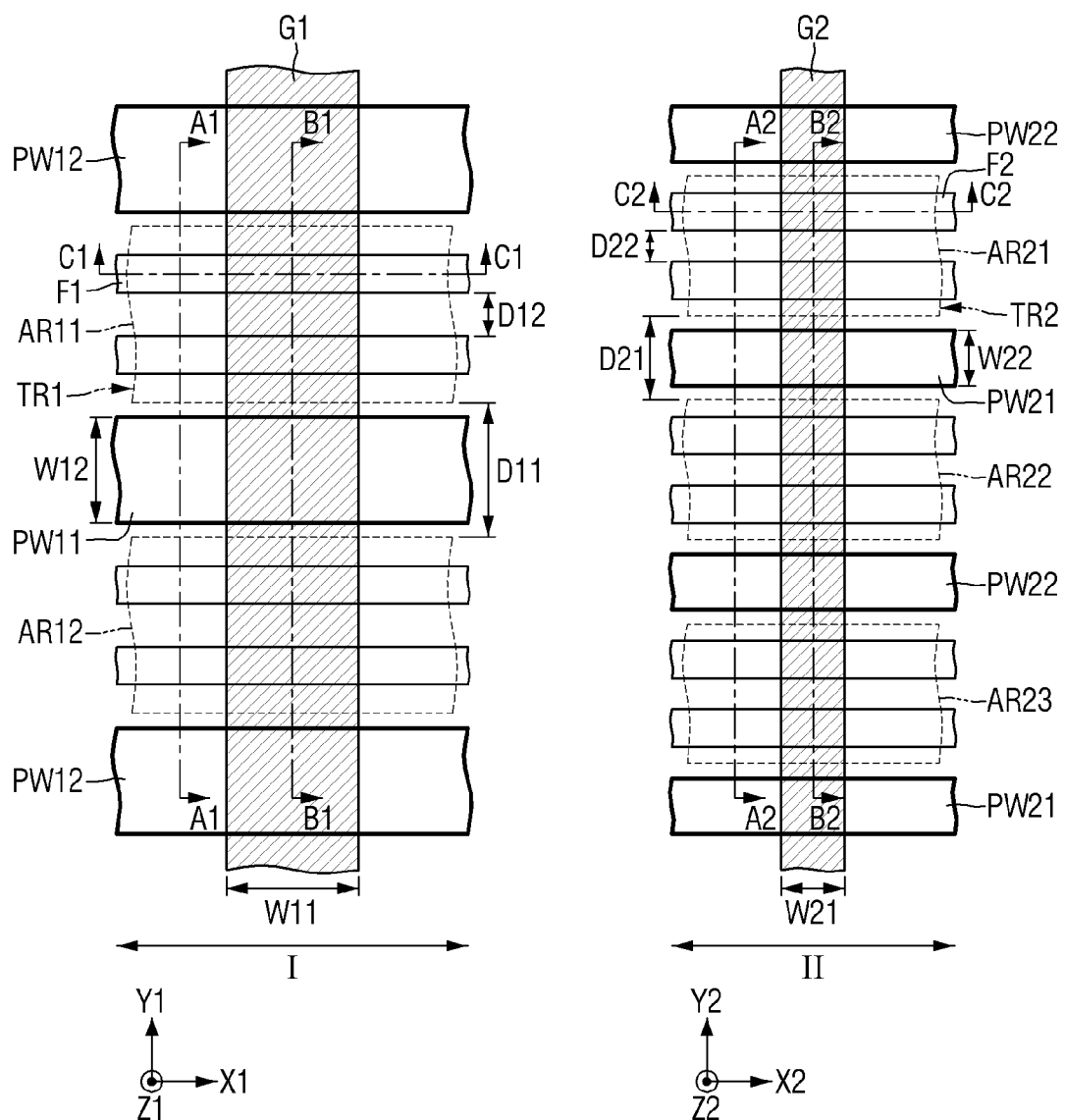
FIG. 1 is a schematic layout diagram for explaining a semiconductor device according to some embodiments.
Figure 2:
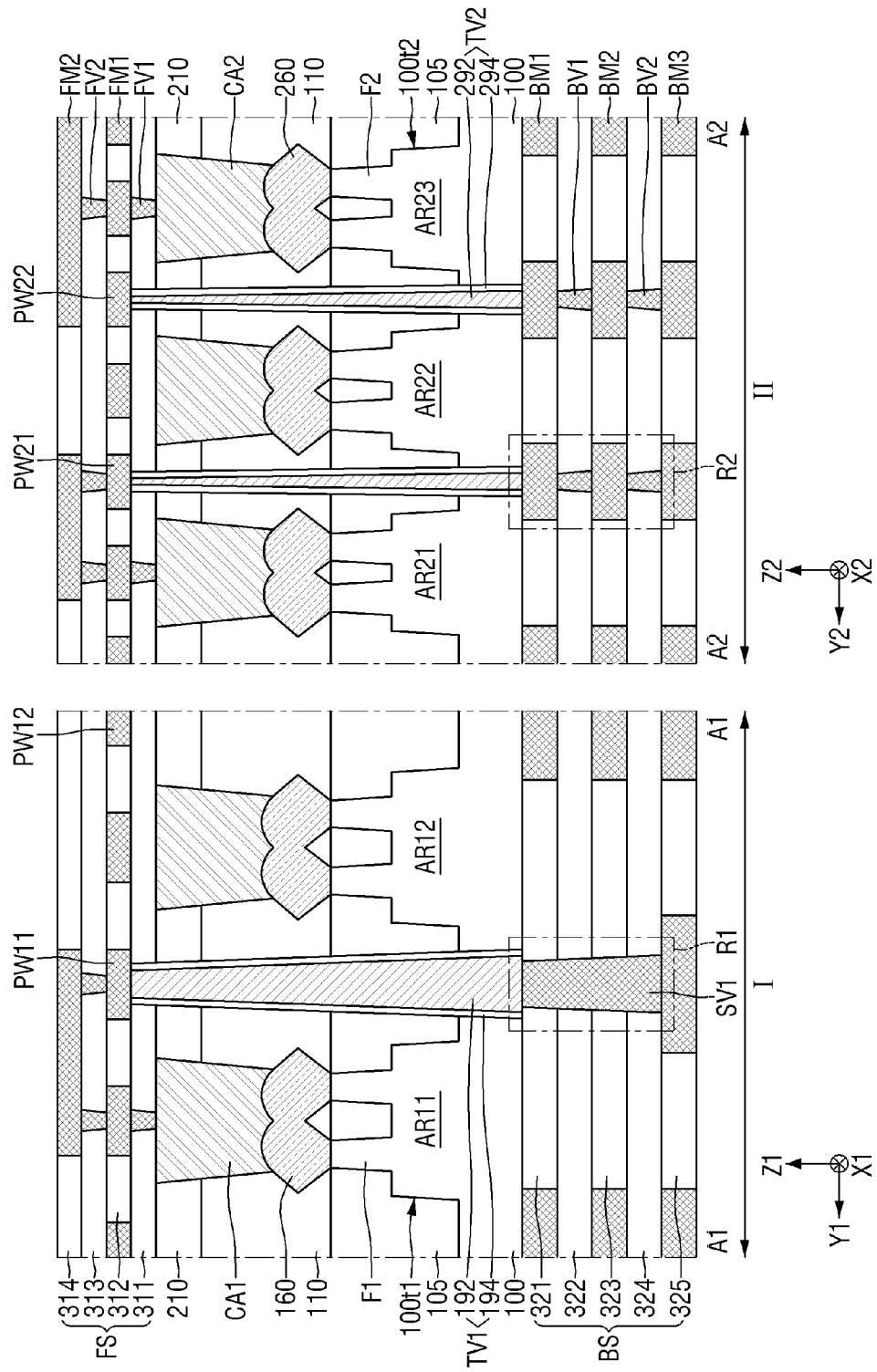
FIG. 2 is a cross-sectional view taken along A1-A1 and A2-A2 of FIG. 1.
Figure 3:
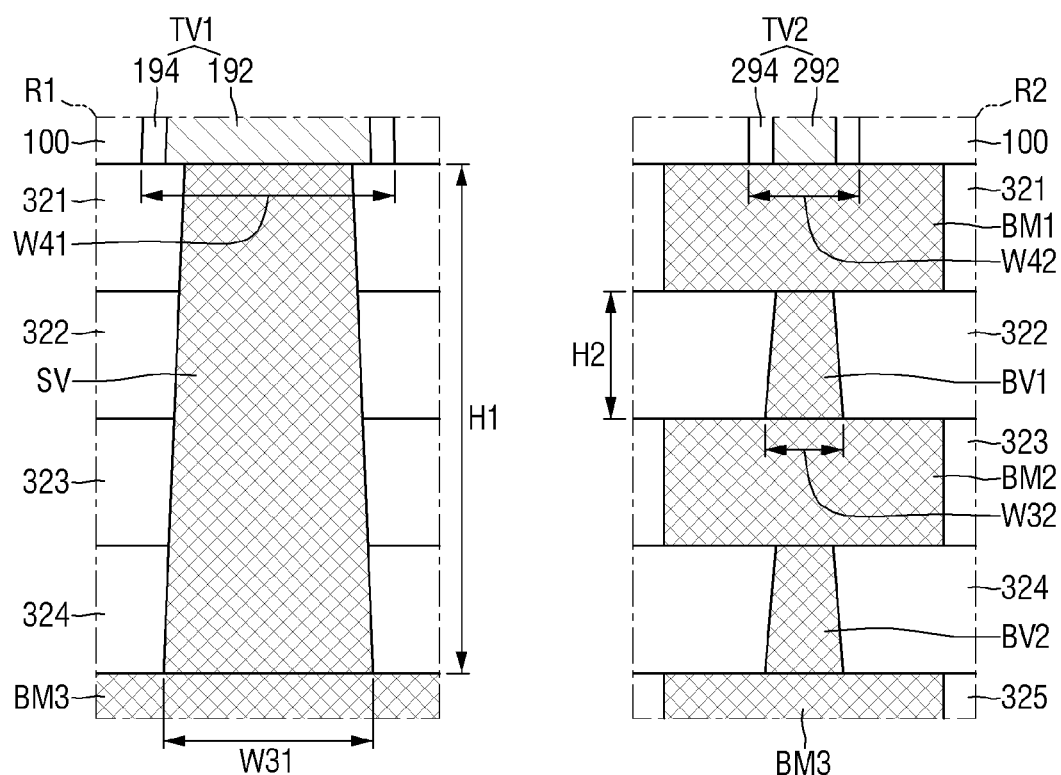
FIG. 3 is an enlarged view for explaining a region R1 and a region R2 of FIG. 2.
Figure 4:
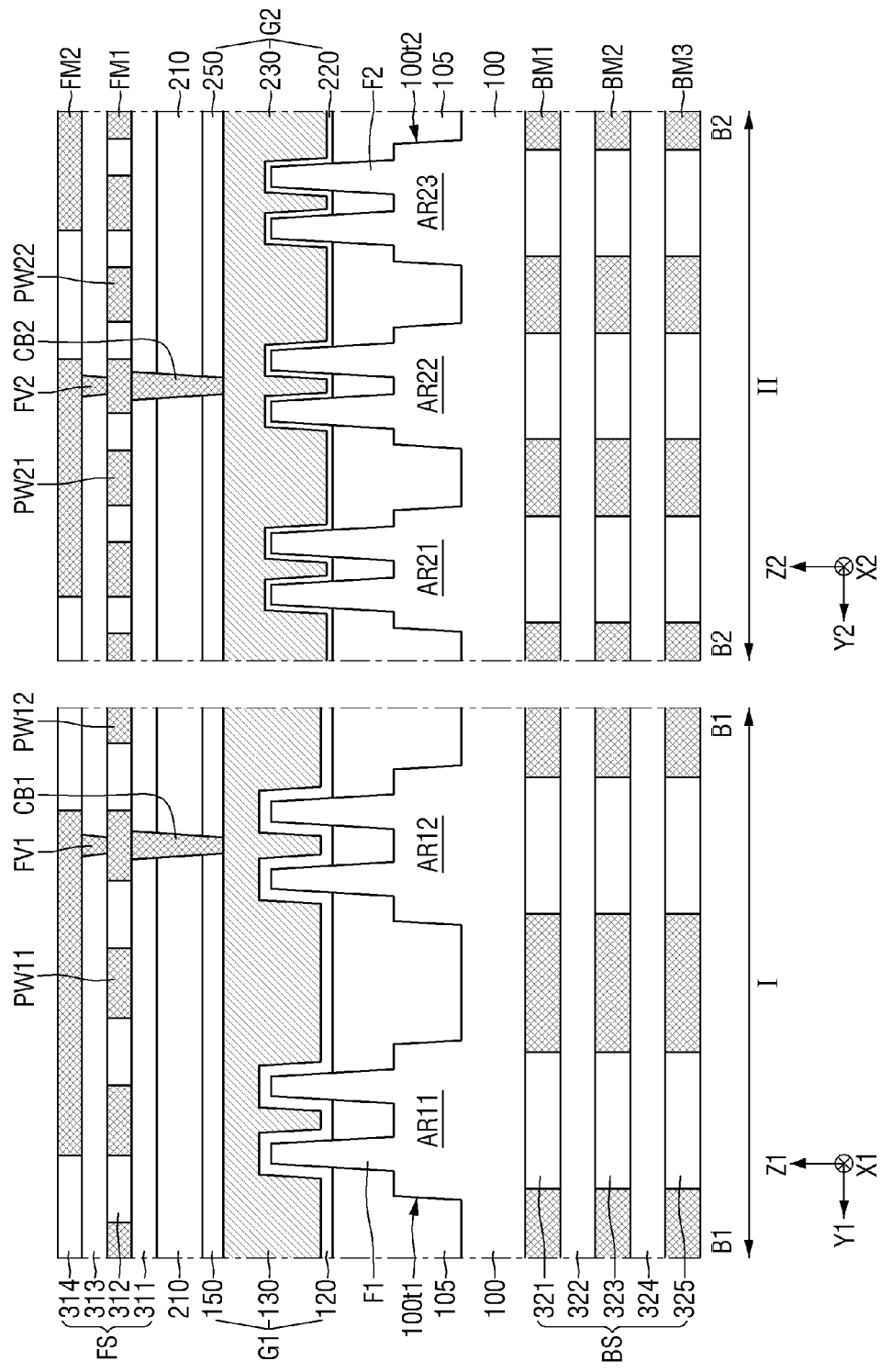
FIG. 4 is a cross-sectional view taken along B1-B1 and B2-B2 of FIG. 1.
Figure 5:
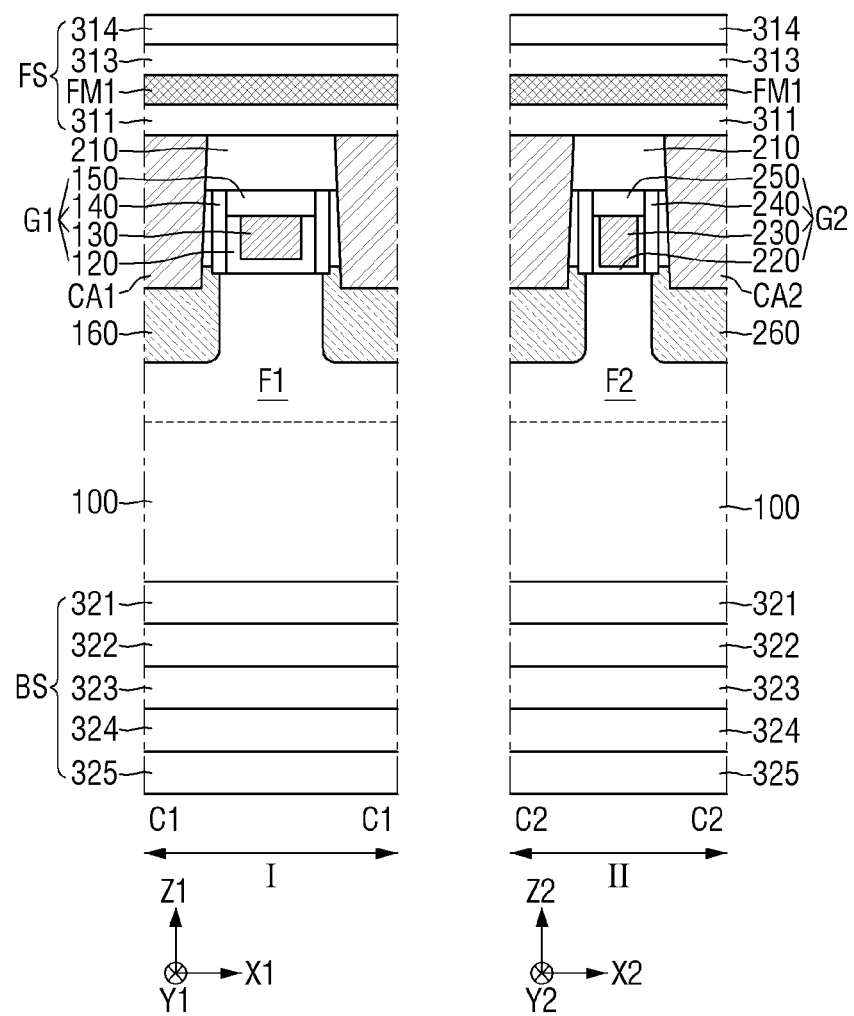
FIG. 5 is a cross-sectional view taken along C1-C1 and C2-C2 of FIG. 1.

FIG. 1 is a schematic layout diagram for explaining a semiconductor device according to some embodiments. FIG. 2 is a cross-sectional view taken along A1-A1 and A2-A2 of FIG. 1. FIG. 3 is an enlarged view for explaining a region R1 and a region R2 of FIG. 2. FIG. 4 is a cross-sectional view taken along B1-B1 and B2-B2 of FIG. 1. FIG. 5 is a cross-sectional view taken along C1-C1 and C2-C2 of FIG. 1.

In FIGS. 1 to 5, although a logic device is shown as an example of a semiconductor device, this is only an example. As another example, the semiconductor device may include a system LSI (large scale integration), a flash memory, a DRAM, a SRAM, an EEPROM, a PRAM, a MRAM or a RERAM, an image sensor such as or a CIS (CMOS imaging sensor), a MEMS (micro-electro-mechanical system), an active element, a passive element, and the like.

Referring to FIGS. 1 to 5, the semiconductor device according to some embodiments include a substrate 100, a first electronic element TR1, a second electronic element TR2, interlayer insulating films 110 and 210, a frontside wiring structure FS, power wirings PW11, PW12, PW21 and PW22, and a backside wiring structure B S.

The substrate 100 may include a first region I and a second region II. The first region I and the second region II may be regions spaced apart from each other or may be regions connected to each other. In some embodiments, the substrate 100 may be bulk silicon or SOI (silicon-on-insulator). In other embodiments, the substrate 100 may be a silicon substrate or may include other substances, for example, but not limited to, silicon germanium, SGOI (silicon germanium on insulator), indium antimonide, lead tellurium compounds, indium arsenide, indium phosphide, gallium arsenide or gallium antimonide.

The first region I of the substrate 100 may include first and second active regions AR11 and AR12. The first and second active regions AR11 and AR12 may be defined by a first element separation trench 100t1 inside or in a portion of the substrate 100. The first element separation trench 100t1 may be a deep trench that is formed in the first region I of the substrate 100. For example, the first element separation trench 100t1 may extend in a first direction X1 parallel to an upper side of the substrate 100 to separate the first and second active regions AR11 and AR12 from each other.

The second region II of the substrate 100 may include third to fifth active regions AR21 AR22, and AR23. The third to fifth active regions AR21 to AR23 may be defined by a second element separation trench 100t2 inside or in a portion of the substrate 100. The second element separation trench 100t2 may be a deep trench that is formed in the second region II of the substrate 100. For example, the second element separation trench 100t2 may extend in a second direction X2 parallel to the upper side of the substrate 100 to separate the third to fifth active regions AR21 to AR23 from each other. Although the first direction X1 and the second direction X2 are shown as being the same direction as each other, this is only an example, and the first direction X1 and the second direction X2 may be different directions from each other.

In the present specification, a surface of the substrate 100 (for example, the upper side of the substrate 100) on which the active regions AR11, AR12 and AR21 to AR23 are formed may be referred to as a frontside of the substrate 100. Also, a surface of the substrate 100 opposite to the frontside of the substrate 100 (for example, a lower side of the substrate 100) may be referred to as a backside of the substrate 100.

In some embodiments, a pitch of or between the first and second active regions AR11 and AR12 may be greater than a pitch of or between the third to fifth active regions AR21 to AR23. For example, a spaced or spacing distance (D11 of FIG. 1) between the first active region AR11 and the second active region AR12 may be greater than a spaced or spacing distance (D21 of FIG. 1) between the third active region AR21 and the fourth active region AR22. As an example, the first region I may be an input/output (I/O) region, and the second region II may be a core region. The input/output region is a region to which an operating voltage for the semiconductor element is applied, and which may be implemented at a lower degree of integration than the core region.

In some embodiments, electronic elements of different conductivity types (e.g., transistors) may be placed alternately on the active region AR11, AR12 and AR21 to AR23. In the following description, the first, third and fifth active regions AR11, AR21 and AR23 will be described as PFET regions and the second and fourth active regions AR12 and AR22 will be described as NFET regions. However, this is only by way of example, and it will be understood that the first, third and fifth active regions AR11, AR21 and AR23 may be NFET regions, and the second and fourth active regions AR12 and AR22 may be PFET regions.

One or more of the first electronic element TR1 (e.g., a first transistor) may be formed on the first region I of the substrate 100, and one or more of the second electronic element TR2 (e.g., a second transistor) may be formed on the second region II of the substrate 100. For example, the first electronic element TR1 may be formed on each of the first and second active regions AR11 and AR12, and the second electronic element TR2 may be formed on each of the third to fifth active regions AR21 to AR23. In some embodiments, the first electronic element TR1 may include a first active pattern F1, a first gate structure G1 and a first source/drain region 160, and the second electronic element TR2 may include a second active pattern F2, a second gate structure G2 and a second source/drain region 260.

The first active pattern F1 may be formed on the upper sides of each of the first and second active regions AR11 and AR12. The plurality of first active patterns F1 are spaced apart from each other and may extend side by side in the first direction X1. Although only two first active patterns F1 are shown as being formed on the first and second active regions AR11 and AR12, this is only an example, and the number of first active patterns F1 may vary. In some embodiments, the first active pattern F1 is a fin type pattern that protrudes from the upper side of the first and second active regions AR11 and AR12 and extends in the first direction X1.

The second active pattern F2 may be formed on the upper sides of each of the third to fifth active regions AR21 to AR23. The plurality of second active patterns F2 are spaced apart from each other and may extend side by side in the second direction X2. Although only two second active patterns F2 are shown as being formed on the third to fifth active regions AR21 to AR23, this is only an example, and the number of second active patterns F2 may vary. In some embodiments, the second active pattern F2 may be a fin type pattern that protrudes from the upper sides of the third to fifth active regions AR21 to AR23 and extends in the second direction X2.

In some embodiments, the pitch of or between the first active patterns F1 may be greater than the pitch of or between the second active patterns F2. For example, the spaced or spacing distance (D12 of FIG. 1) between the first active patterns F1 on the first active region AR11 may be greater than a spaced distance (D22 of FIG. 1) between the second active patterns F2 on the third active region AR21. As an example, the first region I may be an input/output (I/O) region and the second region II may be a core region.

In some embodiments, a field insulating film 105 may be formed on the substrate 100. The field insulating film 105 may surround at least a part of the side surfaces of the active patterns F1 and F2. For example, as shown in FIG. 4, a part of each of the active patterns F1 and F2 may protrude upward from the field insulating film 105. The field insulating film 105 may fill the first element separation trench 100t1 and the second element separation trench 100t2. That is, the active regions AR11, AR12 and AR21 to AR23 may be spaced apart from each other by the field insulating film 105.

The field insulating film 105 may include, for example, but is not limited to, at least one of silicon oxide (SiO$_2$), silicon oxynitride (SiON), silicon oxycarbonitride (SiOCN) or a combination thereof.

The first gate structure G1 may be formed on the first active pattern F1. The first gate structure G1 may intersect the first active pattern F1. For example, the first gate structure G1 may extend in a third direction Y1 that is parallel to the upper side of the substrate 100 and intersects the first direction X1.

The second gate structure G2 may be formed on the second active pattern F2. The second gate structure G2 may intersect the second active pattern F2. For example, the second gate structure G2 may extend in a fourth direction Y2 that is parallel to the upper side of the substrate 100 and intersects the second direction X2.

In some embodiments, a channel length of the first active pattern F1 may be longer than a channel length of the second active pattern F2. For example, a width (W11 of FIG. 1) of the first gate structure G1 may be greater than a width (W21 of FIG. 1) of the second gate structure G2. As an example, the first region I may be an input/output (I/O) region, and the second region II may be a core region.

In some embodiments, the first gate structure G1 and the second gate structure G2 may include gate electrodes 130 and 230, gate dielectric films 120 and 220, gate spacers 140 and 240, and gate capping patterns 150 and 250.

The first gate electrode 130 of the first gate structure G1 may extend in the third direction Y1, and the second gate electrode 230 of the second gate structure G2 may extend in the fourth direction Y2. The gate electrodes 130 and 230 may include, for example, but are not limited to, at least one of Ti, Ta, W, Al, Co and combinations thereof. The gate electrodes 130 and 230 may also include, for example, silicon or silicon germanium other than metal.

Although the gate electrodes 130 and 230 are shown as a single film, the technical idea of the present invention is not limited thereto. Unlike the illustrated example, the gate electrodes 130 and 230 may also be formed by stacking a plurality of conductive materials. For example, the gate electrodes 130 and 230 may include a work function adjusting film that adjusts a work function, and a filling conductive film that fills a space formed by the work function adjusting film. The work function adjusting film may include, for example, at least one of TiN, TaN, TiC, TaC, TiAlC and a combination thereof. The filling conductive film may include, for example, W or Al. The gate electrodes 130 and 230 may be formed, for example, but are not limited to, through a replacement process.

The gate dielectric films 120 and 220 may be interposed between the active patterns F1 and F2 and the gate electrodes 130 and 230. For example, the gate dielectric films 120 and 220 may extend along the upper sides and side surfaces of the active patterns F1 and F2. In some embodiments, the gate dielectric films 120 and 220 may further extend along the upper side of the field insulating film 105. In some embodiments, the gate dielectric films 120 and 220 may further extend along the side surfaces of the gate spacers 140 and 240.

The gate dielectric films 120 and 220 may include, for example, at least one of silicon oxide, silicon oxynitride, silicon nitride, and a high dielectric constant (high-k) material having a higher dielectric constant than silicon oxide. The high dielectric constant material may include, for example, but is not limited to, hafnium oxide.

In some embodiments, the thickness of the first gate dielectric film 120 of the first gate structure G1 may be greater than the thickness of the second gate dielectric film 220 of the second gate structure G2. As an example, the first region I may be an input/output (I/O) region and the second region II may be a core region.

In some embodiments, the dielectric constant of the second gate dielectric film 220 may be greater than the dielectric constant of the first gate dielectric film 120. As an example, the first gate dielectric film 120 may include a silicon oxide, and the second gate dielectric film 220 may include a hafnium oxide.

The gate spacers 140 and 240 may be formed on the substrate 100 and the field insulating film 105. The gate spacers 140 and 240 may extend along both side surfaces of the gate electrodes 130 and 230. The gate spacers 140 and 240 may include, for example, but are not limited to, at least one of silicon oxide, silicon nitride, silicon oxynitride, and a combination thereof.

The gate capping patterns 150 and 250 may extend along the upper sides of the gate electrodes 130 and 230. The gate capping patterns 150 and 250 may include, for example, but are not limited to, at least one of silicon oxide, silicon nitride, silicon oxynitride, and a combination thereof.

The first source/drain region 160 may be formed on the first active pattern F1. For example, the first source/drain region 160 may be formed in portions of the first active pattern F1 on both or opposing sides of the first gate structure G1. The first source/drain region 160 may be spaced apart from the first gate electrode 130 by the first gate spacer 140 of the first gate structure G1.

The second source/drain region 260 may be formed on the second active pattern F2. For example, the second source/drain region 260 may be formed in portions of the second active pattern F2 on both or opposing sides of the second gate structure G2. The second source/drain region 260 may be spaced apart from the second gate electrode 230 by the second gate spacer 240 of the second gate structure G2.

In some embodiments, the first source/drain region 160 may include an epitaxial layer formed on the first active pattern F1, and the second source/drain region 260 may include an epitaxial layer formed on the second active pattern F2. Although the first source/drain region 160 is shown as an epitaxial layer merged to a plurality of first active patterns F1, and the second source/drain region 260 is shown as an epitaxial layer merged to a plurality of second active patterns F2, this is only by way of example. As another example, at least a part of the first source/drain region 160 and the second source/drain region 260 may be an unmerged epitaxial layer.

The first and second source/drain regions 160 and 260 formed on a PFET region (e.g., first, third and fifth active regions AR11, AR21 and AR23) may include p-type impurities or impurities for preventing diffusion of the p-type impurities. For example, the first and second source/drain regions 160 and 260 of the PFET region may each include at least one of B, C, In, Ga, and Al or a combination thereof.

The first and second source/drain regions 160 and 260 formed on the NFET regions (e.g., second and fourth active regions AR12 and AR22) may include n-type impurities or impurities for preventing diffusion of the n-type impurities. For example, the first and second source/drain regions 160 and 260 of the NFET region may each include at least one of P, Sb, As or a combination thereof.

Although the first and second source/drain regions 160 and 260 are only shown as single films, the technical ideas of the invention are not limited thereto. For example, the first and second source/drain regions 160 and 260 may also be formed as multiple epi-layers, each including impurities of different concentrations from each other.

Although only a fin-type transistor (FinFET) including a channel region of a fin-type pattern was described as the first electronic element TR1 and the second electronic element TR2, this is only an example. As another example, the first electronic element TR1 and the second electronic element TR2 may be or include a tunneling transistor (tunneling FET), a transistor including a nanowire, a transistor including a nanosheet, a VFET (Vertical FET), a CFET (Complementary FET) or a three-dimensional (3D) transistor. Further, the first electronic element TR1 and the second electronic element TR2 may each be or include a bipolar junction transistor, a laterally diffused metal oxide semiconductor (LDMOS), or the like.

In some embodiments, the first electronic element TR1 and the second electronic element TR2 may each include an NC (Negative Capacitance) FET that uses a negative capacitor. For example, the gate dielectric films 120 and 220 may include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors that are connected in series has a negative value, the entire capacitance may be greater than an absolute value of each individual capacitance, while having a positive value.

When the ferroelectric material film having the negative capacitance and the paraelectric material film having the positive capacitance are connected in series, the entire capacitance values of the ferroelectric material film and the paraelectric material film that are connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include or may be doped with a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include about 3 to 8 at % (atomic %) aluminum. In this example, a ratio of the dopant may be a ratio of aluminum to the sum of hafnium and aluminum.

When the dopant is silicon (Si), the ferroelectric material film may include about 2 at % to 10 at % silicon. When the dopant is yttrium (Y), the ferroelectric material film may include about 2 at % to 10 at % yttrium. When the dopant is gadolinium (Gd), the ferroelectric material film may include about 1 at % to 7 at % gadolinium. When the dopant is zirconium (Zr), the ferroelectric material film may include about 50 at % to 80 at % zirconium.

The paraelectric material film may have paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, for example, but is not limited to, about 0.5 nm to 10 nm. Since a critical thickness that exhibits the ferroelectric properties may vary for each ferroelectric material, the thickness of the ferroelectric material film may vary depending on the ferroelectric material.

As an example, the gate dielectric films 120 and 220 may include a single ferroelectric material film. As another example, the gate dielectric films 120 and 220 may include a plurality of ferroelectric material films spaced apart from each other. The gate dielectric films 120 and 220 may have a stacked film structure in which a plurality of ferroelectric material films and a plurality of paraelectric material films are alternately stacked.

The interlayer insulating films 110 and 210 may cover the first electronic element TR1 and the second electronic element TR2. For example, the interlayer insulating films 110 and 210 may include a first interlayer insulating film 110 and a second interlayer insulating film 210 that are stacked sequentially on the frontside of the substrate 100 (e.g., the upper side of the substrate 100). The first interlayer insulating film 110 may cover the field insulating film 105, the first source/drain region 160, and the second source/drain region 260. The second interlayer insulating film 210 may cover the first gate structure G1, the second gate structure G2, and the first interlayer insulating film 110.

The interlayer insulating films 110 and 210 may include, for example, but is not limited to, at least one of silicon oxide, silicon oxynitride and a low dielectric constant (low-k) material having a lower dielectric constant than silicon oxide.

The frontside wiring structure FS may be on the frontside of the substrate 100 (e.g., the upper side of the substrate 100). For example, the frontside wiring structure FS may be formed on the upper side of the second interlayer insulating film 210. The frontside wiring structure FS may provide signal lines and power lines for various electronic elements (e.g., the first electronic element TR1 and the second electronic element TR2) formed on the frontside of the substrate 100. The frontside wiring structure FS may include a plurality of frontside inter-wiring insulating films 311, 312, 313, and 314, a plurality of frontside wiring patterns FM1 and FM2, and a plurality of frontside via patterns FV1 and FV2. The number of layers, arrangement and the like of the frontside inter-wiring insulating films 311 to 314, the frontside wiring patterns FM1 and FM2, and the frontside via patterns FV1 and FV2 are only by way of example, and are not limited to the illustrated example.

The frontside inter-wiring insulating films 311 to 314 may be sequentially stacked on the frontside of the substrate 100 (for example, the upper side of the second interlayer insulating film 210). The frontside wiring patterns FM1 and FM2 and the frontside via patterns FV1 and FV2 may be formed inside (e.g., extending at least partially through) the frontside inter-wiring insulating films 311 to 314. The frontside wiring patterns FM1 and FM2 and the frontside via patterns FV1 and FV2 may be insulated from each other by the frontside inter-wiring insulating films 311 to 314, respectively.

The frontside wiring patterns FM1 and FM2 may be stacked sequentially on the frontside of the substrate 100. For example, the first frontside wiring pattern FM1 may be formed inside the second frontside inter-wiring insulating film 312, and the second frontside wiring pattern FM2 may be formed inside the fourth frontside inter-wiring insulating film 314.

The frontside via patterns FV1 and FV2 may be stacked sequentially on the frontside of the substrate 100. The frontside via patterns FV1 and FV2 may interconnect the frontside wiring patterns FM1 and FM2. For example, the first frontside via pattern FV1 may penetrate a first frontside inter-wiring insulating film 311 and may be connected to the first frontside wiring pattern FM1, and the second frontside via pattern FV2 may penetrate the third frontside inter-wiring insulating film 313 and connect the first frontside wiring pattern FM1 and the second frontside wiring pattern FM2. Conductive elements described as "connected" may refer to electrical connections between the conductive elements.

In some embodiments, the width (e.g., along one or more width directions X1, X2, Y1, Y2) of each of the frontside via patterns FV1 and FV2 may decrease toward the frontside of the substrate 100. This may be due to the characteristics of the etching process for forming the frontside via patterns FV1 and FV2.

The frontside wiring structure FS may be connected to the first electronic element TR1. For example, a first source/drain contact CA1 and a first gate contact CB1 may be formed on the first region I. The first source/drain contact CA1 may penetrate the interlayer insulating films 110 and 210 and may be connected to the first source/drain region 160. The first gate contact CB1 may penetrate the first gate capping pattern 150, the interlayer insulating films 110 and 210 and the first frontside inter-wiring insulating film 311, and may be connected to the first gate electrode 130.

In some embodiments, the first source/drain contact CA1 may connect the first source/drain region 160 and the first frontside via pattern FV1. Unlike the illustrated example, in some other embodiments, the first source/drain contact CA1 may penetrate the interlayer insulating films 110 and 210 and the first frontside inter-wiring insulating film 311, and may connect the first source/drain region 160 and the first frontside wiring pattern FM1.

In some embodiments, the first gate contact CB1 may connect the first gate electrode 130 to the first frontside wiring pattern FM1. Unlike the illustrated example, in some other embodiments, the first gate contact CB1 penetrates the interlayer insulating films 110 and 210, and the frontside inter-wiring insulating films 311 and 312, and may connect the first gate electrode 130 and the first frontside via pattern FV1.

The frontside wiring structure FS may be connected to the second electronic element TR2. For example, a second source/drain contact CA2 and a second gate contact CB2 may be formed on the second region II. The second source/ drain contact CA2 penetrates the interlayer insulating films 110 and 210, and may be connected to the second source/drain region 260. The second gate contact CB2 penetrates the second gate capping pattern 250, the interlayer insulating films 110 and 210 and the first frontside inter-wiring insulating film 311, and may be connected to the second gate electrode 230.

In some embodiments, the second source/drain contact CA2 may connect the second source/drain region 260 to the first frontside via pattern FV1. Unlike the illustrated example, in some other embodiments, the second source/drain contact CA2 may penetrate the interlayer insulating films 110 and 210 and the first frontside inter-wiring insulating film 311, and connect the second source/drain region 260 and the first frontside wiring pattern FM1.

In some embodiments, the second gate contact CB2 may connect the second gate electrode 230 to the first frontside wiring pattern FM1. Unlike the illustrated example, in some other embodiments, the second gate contact CB2 may penetrate the interlayer insulating films 110 and 210 and the insulating films 311 and 312, and may connect the second gate electrode 230 and the second frontside via pattern FV2.

In some embodiments, the widths of each of the first source/drain contact CA1, the first gate contact CB1, the second source/drain contact CA2 and the second gate contact CB2 may decrease toward the frontside of the substrate 100. This may be due to the characteristics of the etching process for forming the first source/drain contact CA1, the first gate contact CB1, the second source/drain contact CA2 and the second gate contact CB2.

The power wirings PW11, PW12, PW21 and PW22 may include first and second power wirings PW11 and PW12 on the first region I of the substrate 100, and third and fourth power wirings PW21 and PW22 on the second region II of the substrate 100.

The first and second power wirings PW11 and PW12 may provide different power voltages to the first electronic element TR1. As an example, the first power wiring PW11 may provide a source voltage $V_{SS}$ to the first electronic element TR1, and the second power wiring PW12 may provide a drain voltage $V_{DD}$ to the first electronic element TR1.

In some embodiments, the first and second power wirings PW11 and PW12 may extend in the first direction X1, respectively. In some embodiments, the first and second power wirings PW11 and PW12 may be placed alternately along the third direction Y1.

The third and fourth power wirings PW21 and PW22 may provide different power voltages to the second electronic element TR2. As an example, the third power wiring PW21 may provide the source voltage $V_{SS}$ to the second electronic element TR2, and the fourth power wiring PW22 may provide the drain voltage $V_{DD}$ to the second electronic element TR2.

In some embodiments, the third and fourth power wirings PW21 and PW22 may extend in the second direction X2, respectively. In some embodiments, the third and fourth power wirings PW21 and PW22 may be arranged alternately along the fourth direction Y2.

In some embodiments, the power wirings PW11, PW12, PW21 and PW22 may be interposed between the active regions AR11, AR12 and AR21 to AR23, respectively. For example, the first power wiring PW11 may be interposed between the first active region AR11 and the second active region AR12. In addition, a third power wiring PW21 may be interposed between the third active region AR21 and the fourth active region AR22, and a fourth power wiring PW22 may be interposed between the fourth active region AR22 and the fifth active region AR23.

In some embodiments, the power wirings PW11, PW12, PW21 and PW22 may be formed on the interlayer insulating films 110 and 210. In some embodiments, the power wirings PW11, PW12, PW21 and PW22 may be placed at the same level as a part of the frontside wiring patterns FM1 and FM2. Here, the expression "placed at the same level" means placement at the same height on the basis of the frontside of the substrate 100. However, in this specification, the term "same" means not only exactly the same thing but also includes minute differences that may occur due to process margins and the like. As an example, the power wirings PW11, PW12, PW21 and PW22 may be placed at the same level as the first frontside wiring pattern FM1.

In some embodiments, the first power wiring PW11 and/or the second power wiring PW12 may be connected to the first source/drain region 160. As an example, the first power wiring PW11 may be connected to the first source/drain contact CA1 through the frontside wiring patterns FM1 and FM2 and the frontside via patterns FV1 and FV2. The first power wiring PW11 may be electrically connected to the first source/drain region 160 accordingly.

In some embodiments, the third power wiring PW21 and/or the fourth power wiring PW22 may be connected to the second source/drain region 260. As an example, the third power wiring PW21 may be connected to the second source/drain contact CA2 through the frontside wiring patterns FM1 and FM2 and the frontside via patterns FV1 and FV2. The third power wiring PW21 may be electrically connected to the second source/drain region 260 accordingly.

The backside wiring structure BS may be placed on the backside of the substrate 100 (e.g., the lower side of the substrate 100). The backside wiring structure BS may provide signal lines and power lines for various electronic elements (for example, the first electronic element TR1 and the second electronic element TR2) formed on the frontside of the substrate 100 (e.g., the upper side of the substrate 100). For example, the backside wiring structure BS may include a plurality of backside inter-wiring insulating films 321, 322, 323, 324, and 325, a plurality of backside wiring patterns BM1, BM2, and BM3, a first super via pattern SV1, and a plurality of backside via patterns BV1 and BV2. The number of layers, the arrangement, and the like of the backside inter-wiring insulating films 321 to 325, the backside wiring patterns BM1 to BM3, the backside via patterns BV1 and BV2, and first super via pattern SV1 are examples, and are not limited to the shown example.

The backside inter-wiring insulating films 321 to 325 may be sequentially stacked on the backside of the substrate 100. The backside wiring patterns BM1 to BM3, the backside via patterns BV1 and BV2 and the first super via pattern SV1 may be formed inside (e.g., extending at least partially through) the backside inter-wiring insulating films 321 to 325. The backside wiring patterns BM1 to BM3, the backside via patterns BV1 and BV2 and the first super via pattern SV1 may be insulated from each other by the backside inter-wiring insulating films 321 to 325, respectively.

The backside wiring patterns BM1 to BM3 may be sequentially stacked on the backside of the substrate 100. For example, the first backside wiring pattern BM1 may be formed inside a first backside inter-wiring insulating film 321, the second backside wiring pattern BM2 may be formed inside a third backside inter-wiring insulating film 323, and the third backside wiring pattern BM3 may be formed inside a fifth backside inter-wiring insulating film 325.

The backside via patterns BV1 and BV2 may be stacked sequentially on the backside of the substrate 100. The backside via patterns BV1 and BV2 may interconnect the backside wiring patterns BM1 to BM3. For example, the first backside via pattern BV1 may penetrate a second backside inter-wiring insulating film 322 and connect the first backside wiring pattern BM1 and the second backside wiring pattern BM2. The second backside via pattern BV2 may penetrate a fourth backside inter-wiring insulating film 324 and connect the second backside wiring pattern BM2 and the third backside wiring pattern BM3. Although FIG. 3 only shows that the backside via patterns BV1 and BV2 are placed on the second region II, this is only an example, and the backside via patterns BV1 and BV2 may similarly be placed on the first region I.

In some embodiments, the widths of each of the backside via patterns BV1 and BV2 may decrease toward the backside of the substrate 100. This may be due to the characteristics of the etching process for forming the backside via patterns BV1 and BV2.

The first super via pattern SV1 may penetrate the plurality of backside inter-wiring insulating films among the backside inter-wiring insulating films 321 to 325. Accordingly, the first super via pattern SV1 may intersect at least a part of the plurality of backside wiring patterns BM1 to BM3. As an example, the first super via pattern SV1 may extend from the third backside wiring pattern BM3 and penetrate the first to fourth backside inter-wiring insulating films 321 to 324. Such a first super via pattern SV1 may intersect and may extend through the respective metal layers of the first backside wiring pattern BM1 and the second backside wiring pattern BM2.

In some embodiments, the width of the first super via pattern SV1 may decrease toward the backside of the substrate 100. This may be due to the characteristics of the etching process for forming the first super via pattern SV1.

A height H1 of the first super via pattern SV1 may be greater than a height H2 of each of the backside via patterns BV1 and BV2. Here, the height or height direction means a height in the vertical directions Z1 and Z2 that intersect the backside of the substrate 100 (e.g., the lower side of the substrate 100). For example, as shown in FIG. 3, the height H1 of the first super via pattern SV1 may be greater than the height H2 of the first backside via pattern BV1.

In some embodiments, the height (H1 of FIG. 3) of the first super via pattern SV1 may be more than about 1.5 times the height (H2 of FIG. 3) of each of the backside via patterns BV1 and BV2. As an example, the height H1 of the first super via pattern SV1 may be more than about 1.5 times to about 10 times the height H2 of each of the backside via patterns BV1 and BV2. Preferably, the height H1 of the first super via pattern SV1 may be more than about 1.5 to about 5 times the height H2 of each of the backside via patterns BV1 and BV2. Accordingly, the first super via pattern SV1 may have reduced resistance compared to the backside via patterns BV1 and BV2. The height H1 of the first super via pattern SV1 and the height H2 of the backside via patterns BV1 and BV2 may be, but are not limited to, tens of nm to hundreds of nm.

In some embodiments, the width (W31 of FIG. 3) of the first super via pattern SV1 may be equal to or greater than the width (W32 of FIG. 3) of each of the backside via patterns BV1 and BV2. As an example, the width W31 of the first super via pattern SV1 may be more than about 1 to about 10 times the width W32 of each of the backside via patterns BV1 and BV2. Preferably, the width W31 of the first super via pattern SV1 may be about 1 to about 5 times the width W32 of each of the backside via patterns BV1 and BV2. Accordingly, the first super via pattern SV1 may have further reduced resistance than the backside via patterns BV1 and BV2. The width W31 of the first super via pattern SV1 and the width W32 of the backside via patterns BV1 and BV2 may be, but are not limited to, tens of nm to hundreds of nm.

Although not specifically shown, the frontside wiring patterns FM1 and FM2, the frontside via patterns FV1 and FV2, the backside wiring patterns BM1 to BM3, the backside via patterns BV1 and BV2, and the first super via pattern SV1 may include a barrier conductive film and a filling conductive film, respectively. The barrier conductive film may include a metal or a metal nitride for preventing diffusion of the filling conductive film. The barrier conductive film may include, for example, but is not limited to, at least one of titanium (Ti), tantalum (Ta), tungsten (W), nickel (Ni), cobalt (Co), platinum (Pt), alloys thereof, and nitrides thereof. The filling conductive film may include, for example, but is not limited to, at least one of aluminum (Al), copper (Cu), tungsten (W), molybdenum (Mo), cobalt (Co), ruthenium (Ru), and alloys thereof.

The backside wiring structure BS may be connected to the first electronic element TR1. For example, a first through via TV1 may be formed on the first region I. The first through via TV1 may penetrate the substrate 100 and the interlayer insulating films 110 and 210, and connect the backside wiring structure BS and the frontside wiring structure FS on the first region I. In some embodiments, the first through via TV1 may be interposed between the first and second active regions AR11 and AR12.

In some embodiments, the first super via pattern SV1 may be placed on the first region I. In some embodiments, the first through via TV1 may connect the first super via pattern SV1 to the first power wiring PW11 and/or the second power wiring PW12. As an example, the first through via TV1 may penetrate the substrate 100, the interlayer insulating films 110 and 210, and the first frontside inter-wiring insulating film 311, and connect the first super via pattern SV1 and the first power wiring PW11. The backside wiring structure BS may be electrically connected to the first source/drain region 160 accordingly. Such a backside wiring structure BS may implement a power delivery network (PDN) for the first region I on the backside of the substrate 100.

The backside wiring structure BS may be connected to the second electronic element TR2. For example, a second through via TV2 may be formed on the second region II. The second through via TV2 may penetrate the substrate 100 and the interlayer insulating films 110 and 210 and connect the backside wiring structure BS and the frontside wiring structure FS on the second region II. In some embodiments, the second through via TV2 may be interposed between the third to fifth active regions AR21 to AR23.

In some embodiments, the second through via TV2 may connect the first backside wiring pattern BM1 to the third power wiring PW21 and/or the fourth power wiring PW22. As an example, the second through via TV2 may penetrate the substrate 100, the interlayer insulating films 110 and 210, and the first frontside inter-wiring insulating film 311, and connect the first backside wiring pattern BM1 and the third power wiring PW21. The backside wiring structure BS may be electrically connected to the second source/drain region 260 accordingly. Such a backside wiring structure BS may implement a power delivery network (PDN) for the second region II on the backside of the substrate 100.

In some embodiments, the width of the first through via TV1 and the width of the second through via TV2 may decrease from the backside wiring structure BS toward the frontside wiring structure FS, respectively. This may be due to the characteristics of the etching process for forming the first through via TV1 and the second through via TV2.

In some embodiments, a width (W41 of FIG. 3) of the first through via TV1 may be greater than a width (W42 of FIG. 3) of the second through via TV2. As an example, this may be attributed to the pitch of the first and second active regions AR11 and AR12 greater than the pitch of the third to fifth active regions AR21 to AR23. As an example, the first region I may be an input/output (I/O) region, and the second region II may be a core region.

In some embodiments, the first through via TV1 and the second through via TV2 may include through conductive films 192 and 292 and through insulating films 194 and 294, respectively. The through insulating films 194 and 294 may extend along the side surfaces of the through conductive films 192 and 292. The through insulating films 194 and 294 may include an insulating substance for electrically insulating the through conductive films 192 and 292 from the substrate 100. The through insulating films 194 and 294 may include, for example, but are not limited to, at least one of silicon oxide ($SiO_2$), silicon oxynitride (SiON), silicon oxycarbonitride (SiOCN) or a combination thereof. The through conductive films 192 and 292 may include, for example, but are not limited to, at least one of aluminum (Al), copper (Cu), tungsten (W), molybdenum (Mo), cobalt (Co), ruthenium (Ru), and alloys thereof.

As the semiconductor devices are gradually highly integrated, the widths of wiring patterns and via patterns which implement the semiconductor devices gradually decrease. Accordingly, a voltage drop (e.g., an IR drop) of the power delivery network (PDN) that supplies the power voltage to the electronic element may become important.

In the semiconductor device according to some embodiments, the power delivery network (PDN) may have a reduced voltage drop by being implemented on the backside of the substrate 100 (e.g., the lower side of the substrate 100). Specifically, as described above, the backside wiring structure BS which implements the power delivery network (PDN) may be placed on the backside of the substrate 100. Accordingly, the frontside wiring structure FS may be formed to be relatively greater than the power delivery network (PDN) implemented on the frontside of the substrate 100 (e.g., the upper side of the substrate 100). Therefore, the semiconductor device according to some embodiments may provide improved (PPA Power, Performance, Area).

Further, in the semiconductor device according to some embodiments, the backside wiring structure BS may reduce the voltage drop caused by the via patterns, by the use of the first super via pattern SV1. Specifically, interfaces or contact areas between the via patterns and the wiring patterns (for example, an interface between the backside wiring patterns BM1 to BM3 and the backside via patterns BV1 and BV2) accounts for a great part in the resistance of the via patterns. However, as described above, the first super via pattern SV1 may be formed to penetrate the plurality of backside inter-wiring insulating films among the backside inter-wiring insulating films 321 to 325. Accordingly, the voltage drop that occurs at the interface between the via patterns and the wiring patterns may be reduced or minimized, and a semiconductor device having improved PPA may be provided.

FIGS. 6 to 15 are various cross-sectional views for explaining a semiconductor device according to some embodiments. For convenience of explanation, repeated parts of contents explained above using FIGS. 1 to 5 will be briefly explained or omitted. For reference, FIGS. 6 to 15 are various other cross-sectional views taken along A1-A1 and A2-A2 of FIG. 1.

Figure 6:
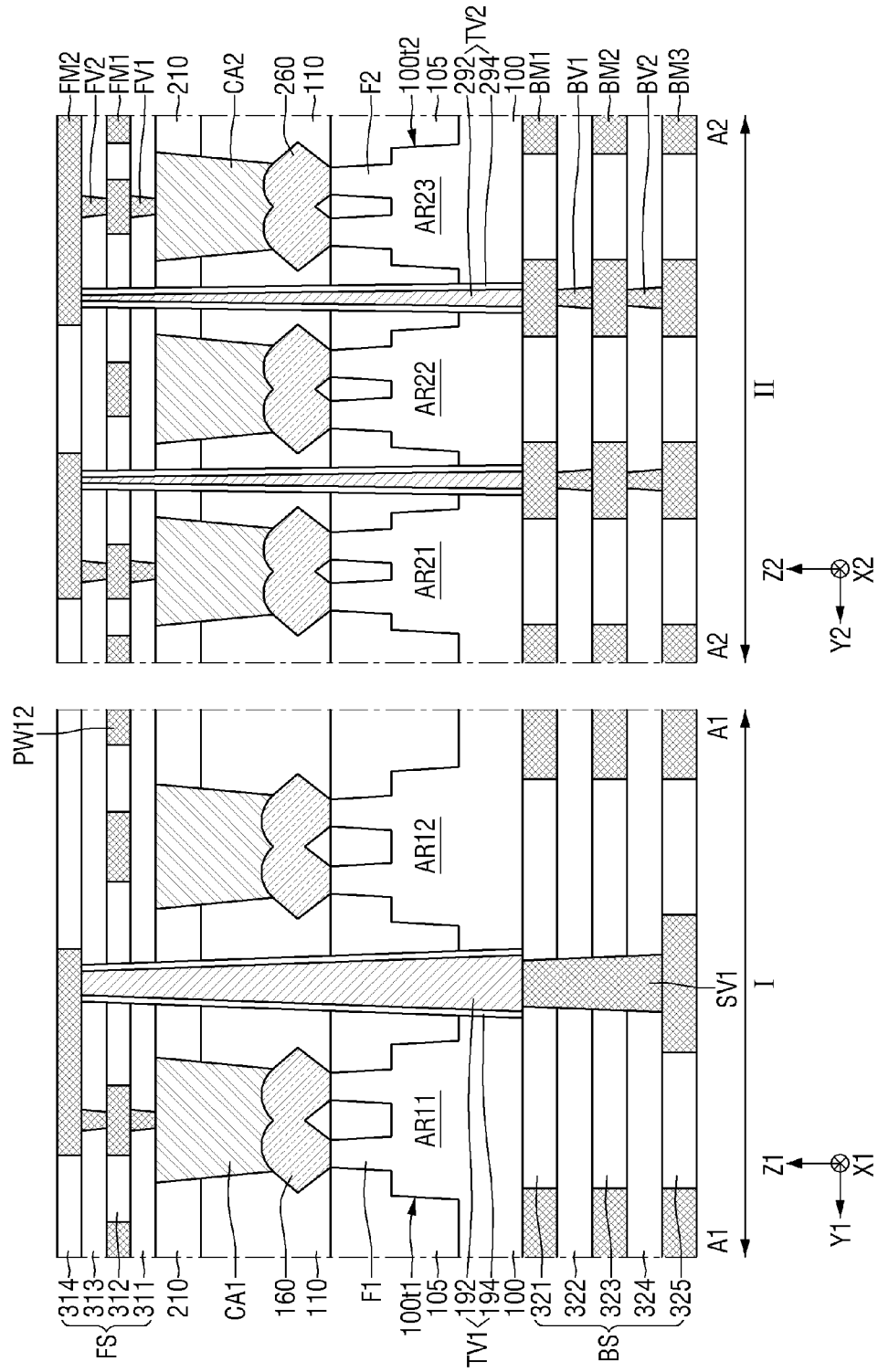
FIGS. 6, 7, 8, 9, 10, 11, 12, 13, 14, and 15 are various cross-sectional views for explaining a semiconductor device according to some embodiments.

Referring to FIG. 6, in the semiconductor device according to some embodiments, the first through via TV1 and/or the second through via TV2 is connected to the second frontside wiring pattern FM2.

As an example, the first through via TV1 and the second through via TV2 may penetrate the substrate 100, the interlayer insulating films 110 and 210, and the first to third frontside wiring insulating films 313 to 313, and may be connected to the second frontside wiring pattern FM2. Although both the first through via TV1 and the second through via TV2 are only shown as being connected to the second frontside wiring pattern FM2, this is only by way of example. As another example, one of the first through via TV1 and the second through via TV2 may be connected to the first frontside wiring pattern FM1, as shown in FIGS. 1 to 5.

In some embodiments, the second frontside wiring pattern FM2 connected to the first through via TV1 and/or the second through via TV2 may function as the power wiring (e.g., the power wirings PW11, PW12, PW21 and PW22 of FIGS. 1 to 5).

Figure 7:
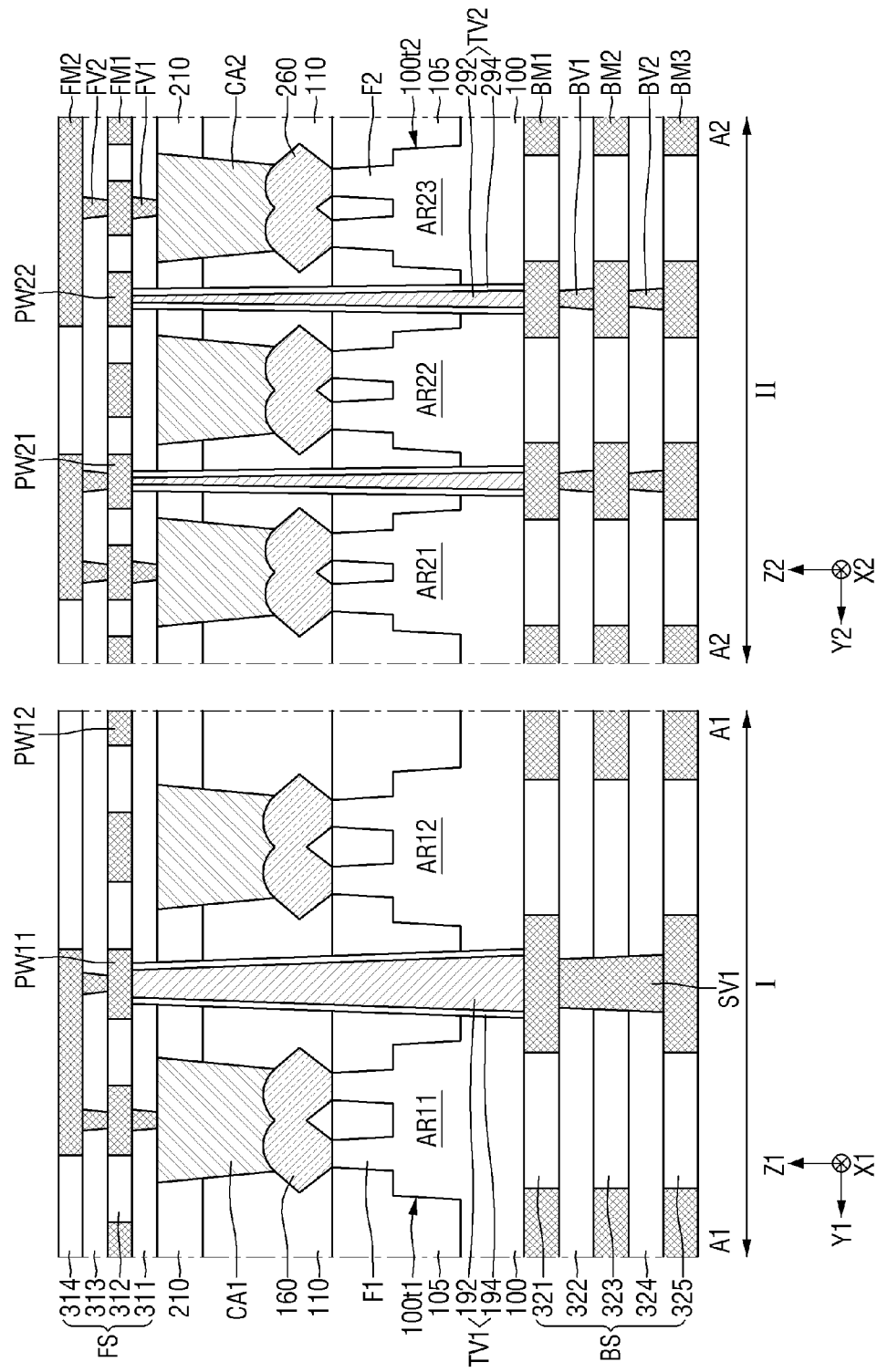

Referring to FIG. 7, in the semiconductor device according to some embodiments, the first super via pattern SV1 connects the backside wiring patterns BM1 to BM3 to each other.

As an example, the first super via pattern SV1 may penetrate the second to fourth backside inter-wiring insulating films 322 to 324, and connect the first backside wiring pattern BM1 and the third backside wiring pattern BM3. Such a first super via pattern SV1 may intersect and extend through the metal layer of the second backside wiring pattern BM2.

Figure 8:
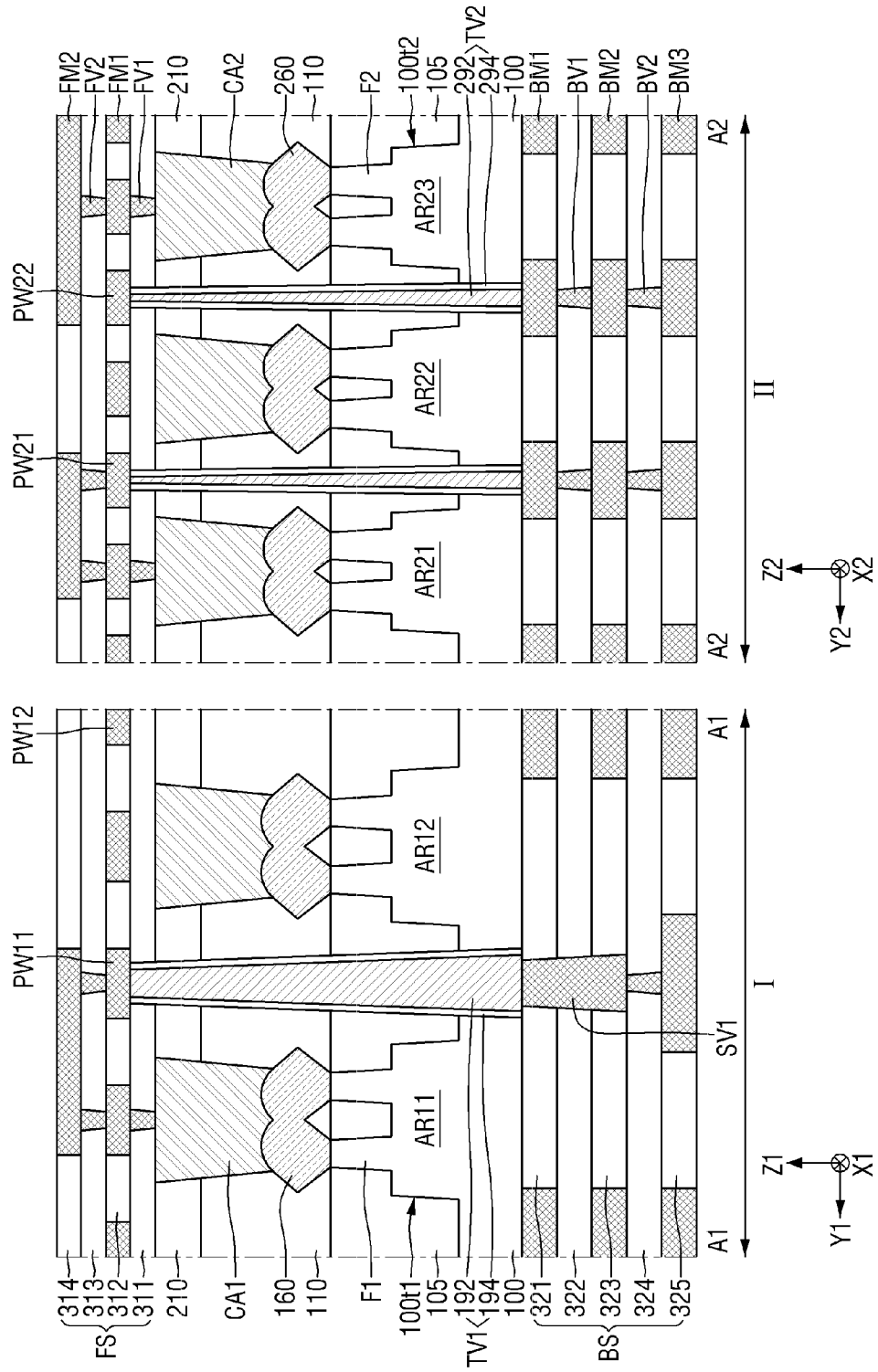

Referring to FIG. 8, in the semiconductor device according to some embodiments, the first super via pattern SV1 is connected to a part of the backside via patterns BV1 and BV2.

As an example, the first super via pattern SV1 may penetrate the first to third backside inter-wiring insulating films 321 to 323, and connect the second backside via pattern BV2 and the first through via TV1. Such a first super via pattern SV1 may intersect and extend through the layer of the first backside wiring pattern BM1 and the second backside wiring pattern BM2.

Figure 9:
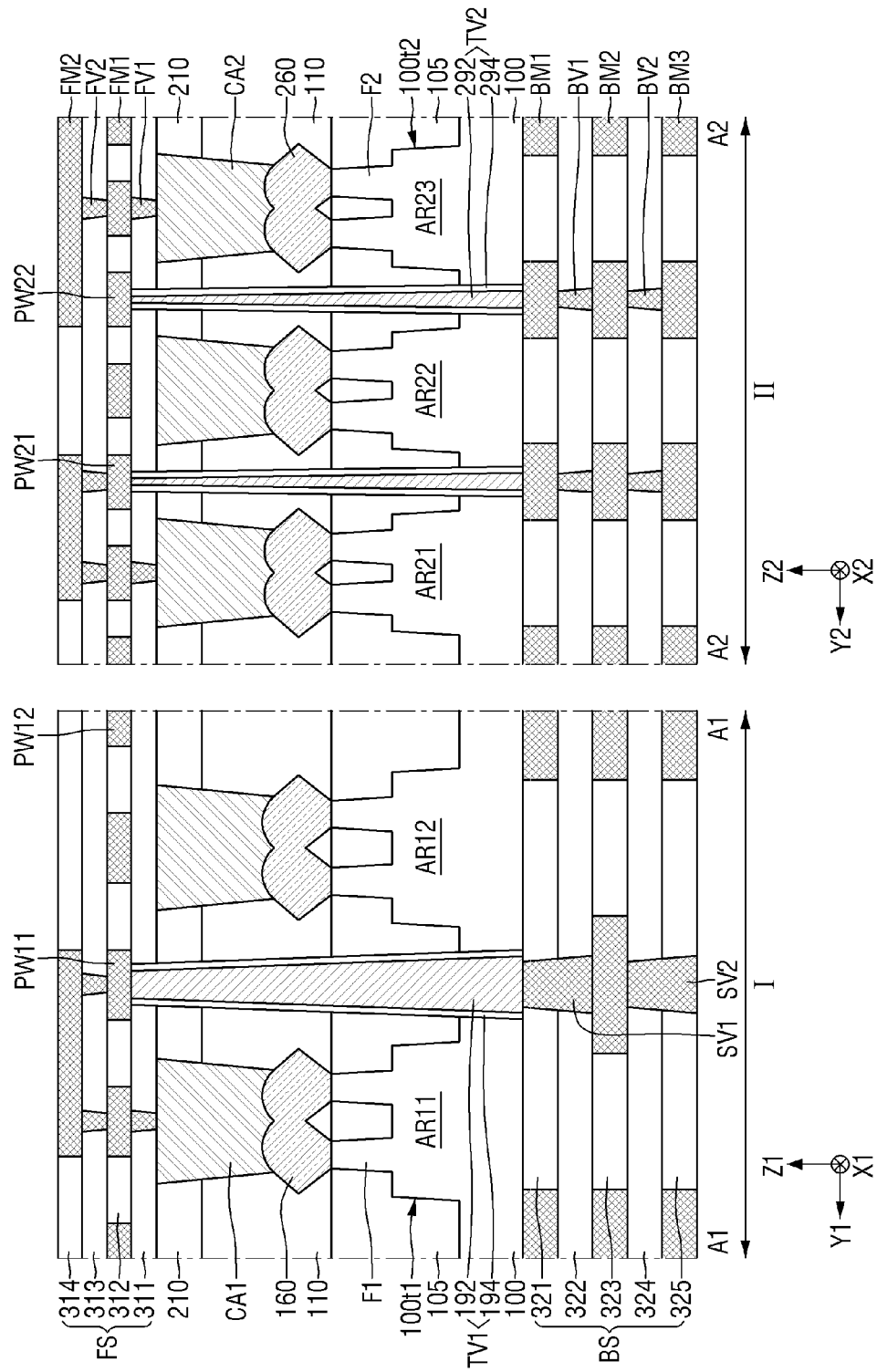

Referring to FIG. 9, the semiconductor device according to some embodiments further includes a second super via pattern SV2 connected to the first super via pattern SV1.

As an example, the first super via pattern SV1 may penetrate the first and second backside inter-wiring insulating films 321 and 322, and connect the second backside wiring pattern BM2 and the first through via TV1. The second super via pattern SV2 may penetrate the fourth and fifth backside inter-wiring insulating films 324 and 325, and may be connected to the second backside wiring pattern BM2. Such a second super via pattern SV2 may intersect and extend through the layer of the third backside wiring pattern BM3.

Since the second super via pattern SV2 is similar to the first super via pattern SV1 except for those differences described above with reference to FIG. 8, detailed description thereof will not be provided below.

Figure 10:
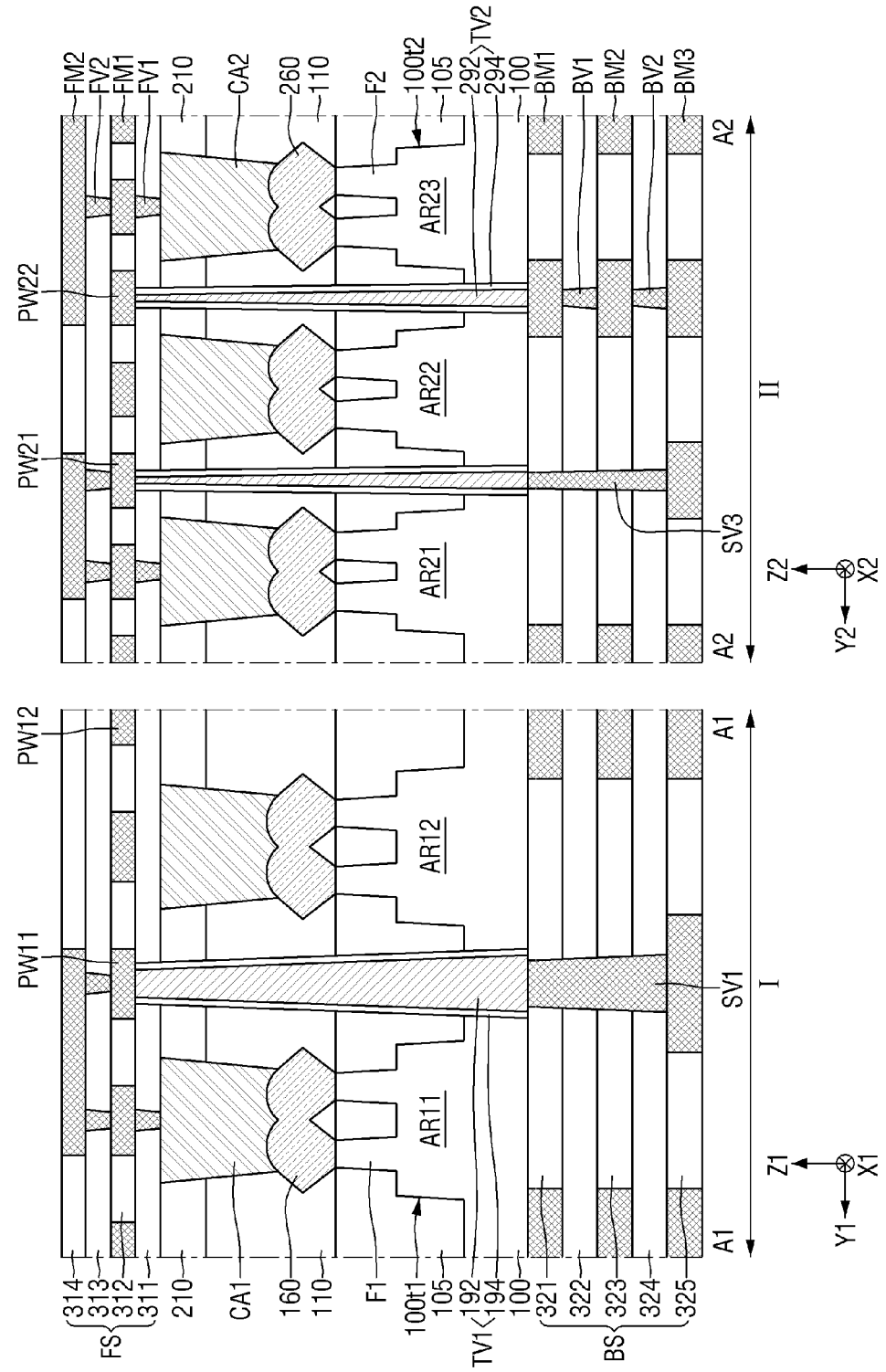

Referring to FIG. 10, a semiconductor device according to some embodiments further includes a third super via pattern SV3 placed on the second region II.

As an example, the third super via pattern SV3 may penetrate the first to fourth backside inter-wiring insulating films 321 to 324 on the second region II, and connect the third backside wiring pattern BM3 and the second through via TV2. Such a third super via pattern SV3 may intersect and extend through the respective layers of the first backside wiring pattern BM1 and the second backside wiring pattern BM2.

Since the third super via pattern SV3 is similar to the first super via pattern SV1 except for those differences explained above with reference to FIG. 10, detailed description thereof will not be provided below.

Figure 11:
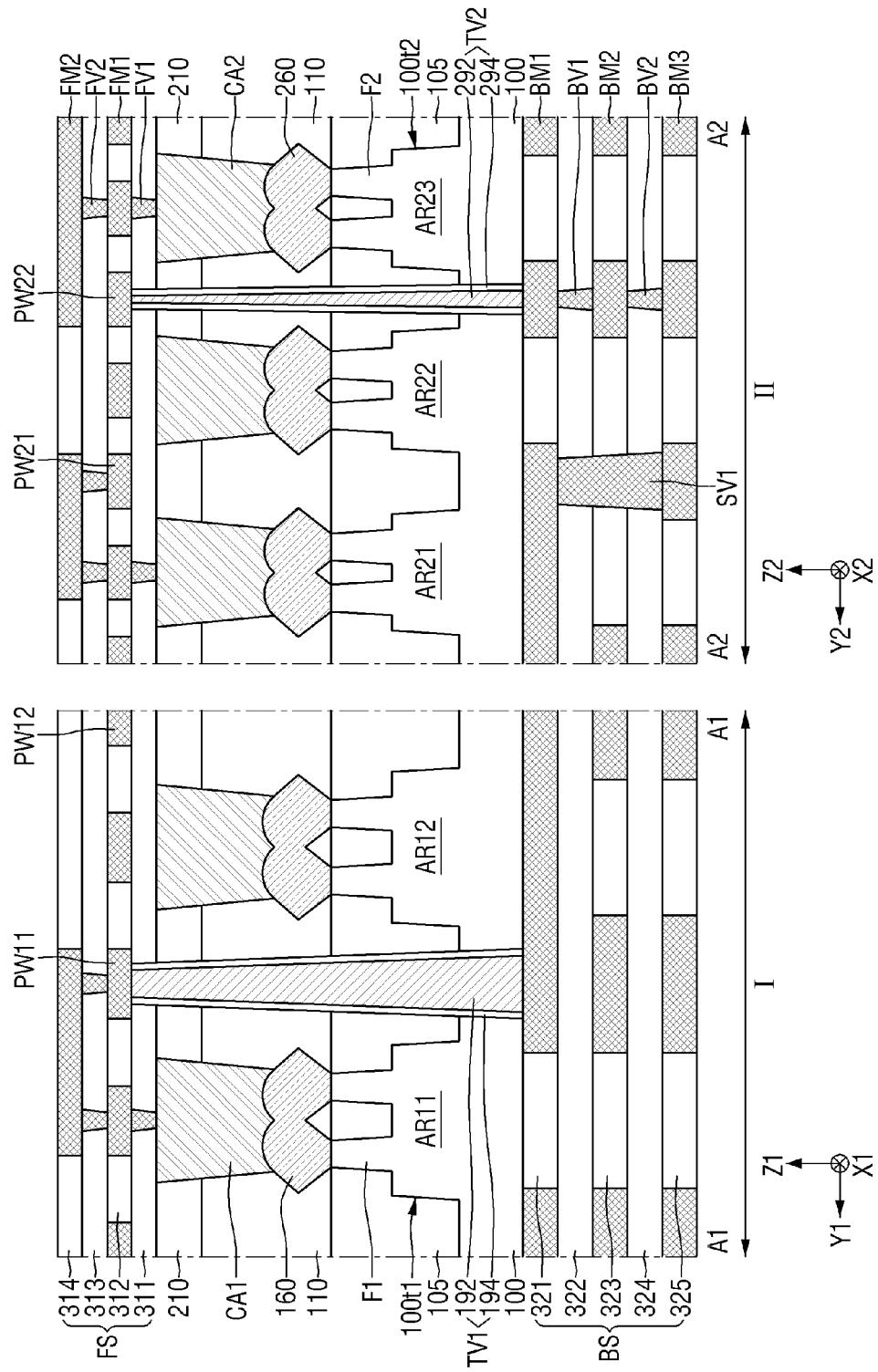

Referring to FIG. 11, in the semiconductor device according to some embodiments, the first super via pattern SV1 is placed on the second region II.

As an example, the first super via pattern SV1 may penetrate the second to fourth backside inter-wiring insulating films 322 to 324 on the second region II, and connect the third backside wiring pattern BM3 and the first backside wiring pattern BM1. Such a first super via pattern SV1 may intersect and extend through the layer of the second backside wiring pattern BM2.

In some embodiments, the first super via pattern SV1 placed on the second region II may be connected to the first through via TV1. For example, the first super via pattern SV1 may be connected to the first through via TV1 through the first backside wiring pattern BM1. The first super via pattern SV1 placed on the second region II may implement the power delivery network (PDN) for the first region I accordingly.

Figure 12:
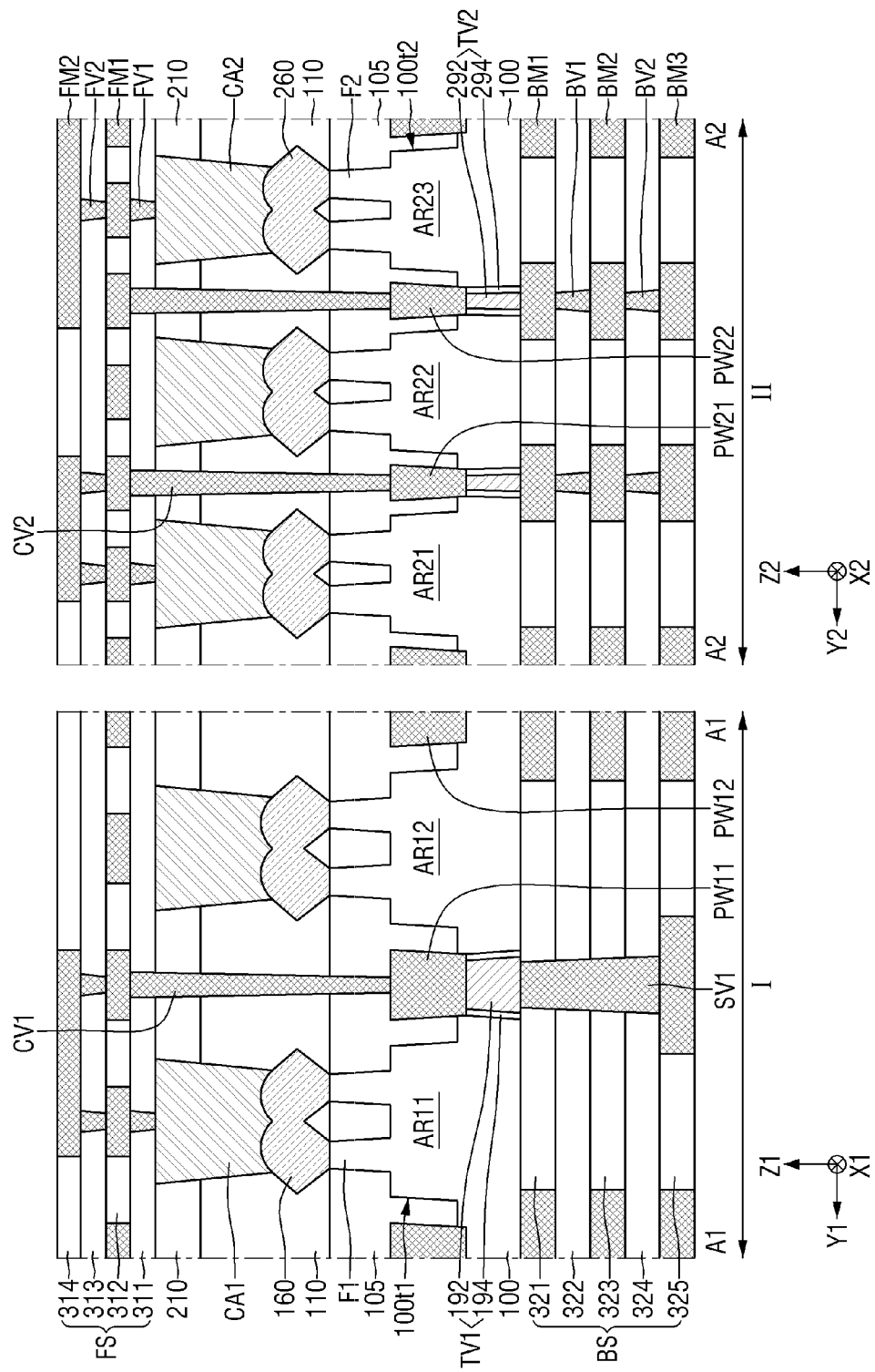
Figure 13:
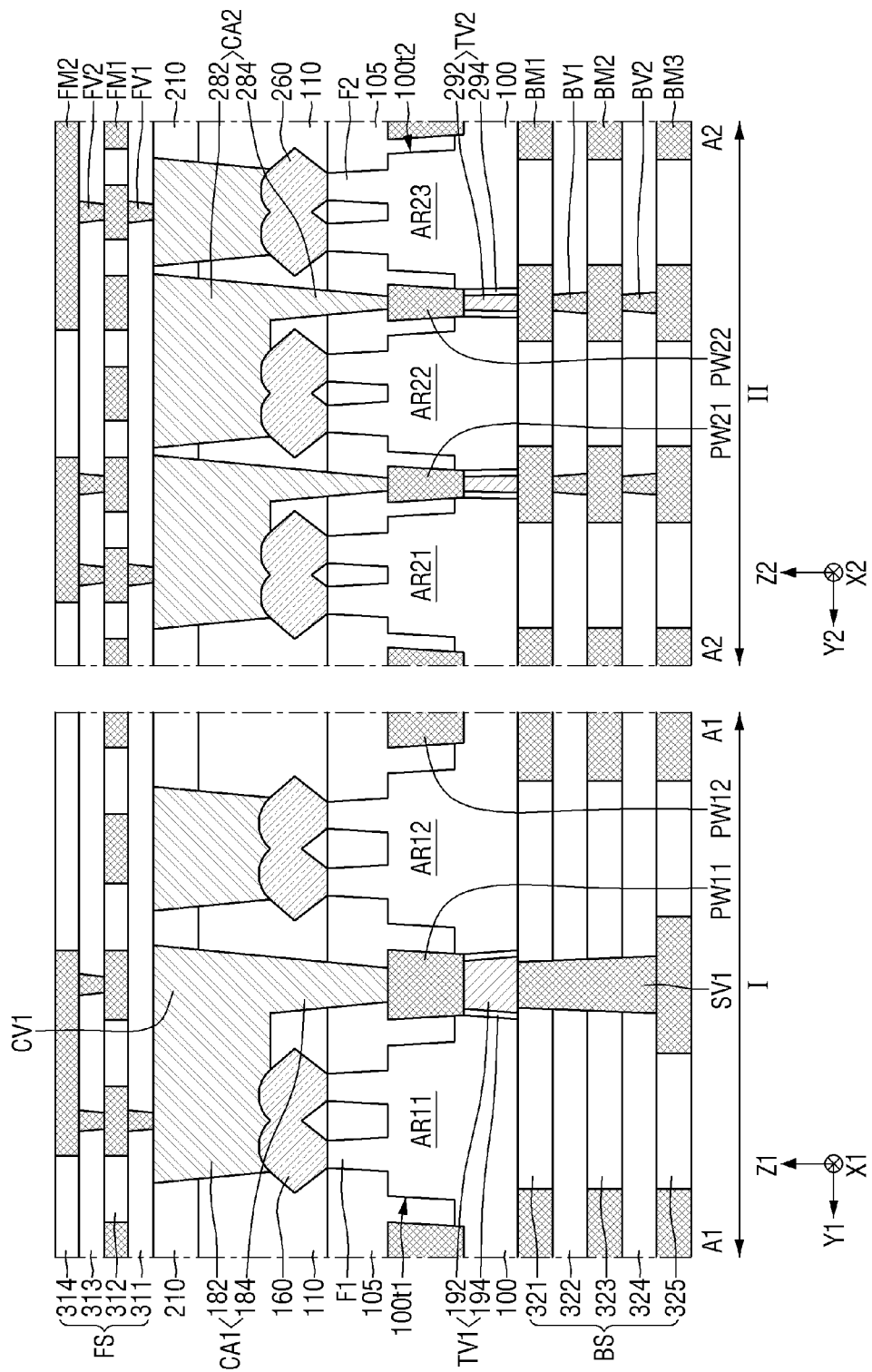

Referring to FIGS. 12 and 13, in the semiconductor device according to some embodiments, the power wirings PW11, PW12, PW21 and PW22 are embedded inside or within the substrate 100.

For example, the first and second power wirings PW11 and PW12 may be placed inside the first element separation trenches 100t1, and the third and fourth power wirings PW21 and PW22 may be placed inside the second element separation trenches 100t2. The field insulating film 105 may cover the power wirings PW11, PW12, PW21 and PW22. In some embodiments, a part of the field insulating film 105 may be interposed between the substrate 100 and the power wirings PW11, PW12, PW21 and PW22.

Although FIG. 12 only shows that the lower sides of the power wirings PW11, PW12, PW21 and PW22 are lower than the lower side of the first element separation trenches 100t1 and the lower side of the second element separation trenches 100t2, this is only an example. As another example, the lower sides of the power wirings PW11, PW12, PW21 and PW22 may be the same as or higher than the lower side of the first element separation trenches 100t1 and the lower side of the second element separation trenches 100t2.

In some embodiments, the first through via TV1 may penetrate the substrate 100 and connect the first super via pattern SV1 and the first power wiring PW11 and/or the second power wiring PW12. In some embodiments, the second through via TV2 may penetrate the substrate 100, and connect the first backside wiring pattern BM1 and the third power wiring PW21 and/or the fourth power wiring pattern PW22.

Referring to FIG. 13, in the semiconductor device according to some embodiments, the first source/drain contact CA1 and/or the second source/drain contact CA2 includes first contact portions 182 and 282 and second contact portions 184 and 284.

The first contact portions 182 and 282 may come into contact with the first source/drain region 160 and/or the second source/drain region 260. The second contact portions 184 and 284 may protrude from the lower sides of the first contact portions 182 and 282 and come into contact with the power wirings PW11, PW12, PW21 and PW22. For example, the second contact portions 184 and 284 may penetrate the field insulating film 105 and the first interlayer insulating film 110 and come into contact with the first power wiring PW11 and/or the third power wiring PW21. Although the first source/drain contact CA1 and the second source/drain contact CA2 are only shown to include the first contact portions 182 and 282 and the second contact portions 184 and 284, this is only an example. As another example, one of the first source/drain contacts CA1 and the second source/drain contact CA2 may not include the second contact portions 184 and 284.

Figure 14:
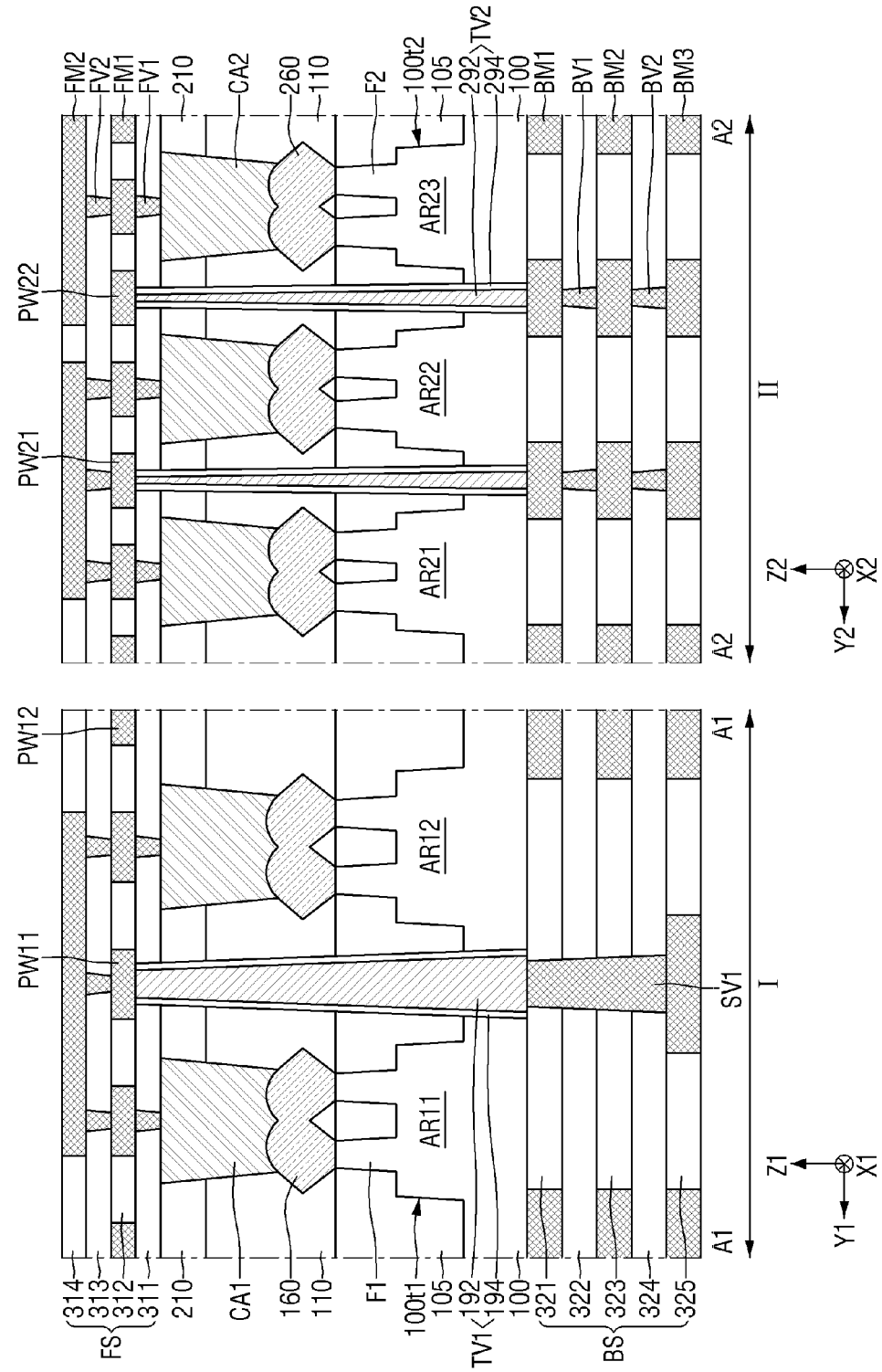

Referring to FIG. 14, in a semiconductor device according to some embodiments, the frontside wiring structure FS interconnect a plurality of first source/drain regions 160 and/or a plurality of second source/drain regions 260.

For example, the frontside wiring structure FS on the first region I may interconnect the first source/drain region 160 on the first active region AR11 and the first source/drain region 160 on the second active region AR12. Also, for example, the frontside wiring structure FS on the second region II may interconnect the second source/drain region 260 on the third active region AR21 and the second source/drain region 260 on the fourth active region AR22.

Figure 15:
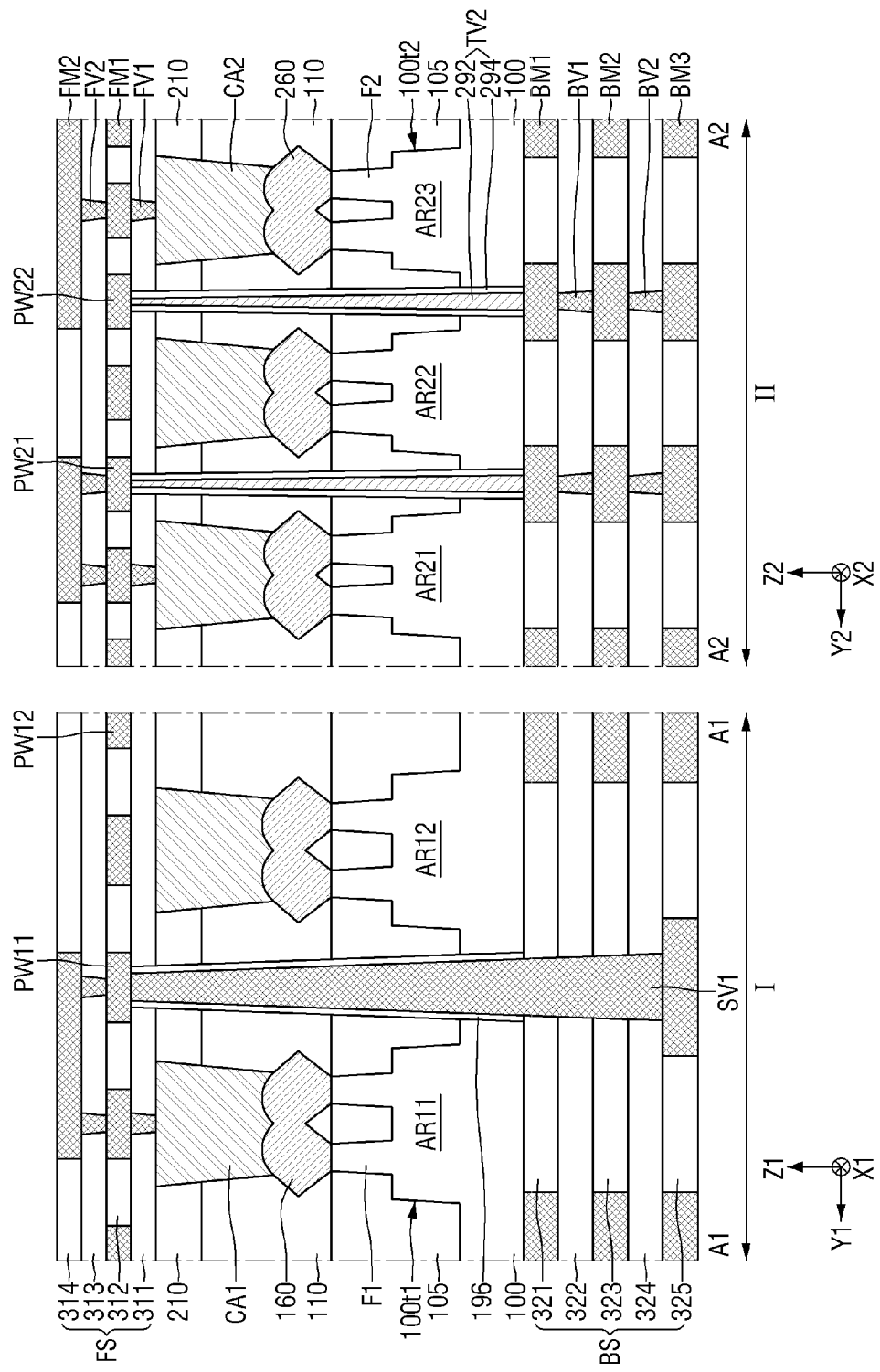

Referring to FIG. 15, in a semiconductor device according to some embodiments, the first super via pattern SV1 comes into contact with the first power wiring PW11 and/or the second power wiring PW12.

As an example, the first super via pattern SV1 may penetrate the first to fourth backside inter-wiring insulating films 321 to 324, the field insulating film 105, the interlayer insulating films 110 and 210, and the first frontside inter-wiring insulating film 311, and connect the third backside wiring pattern BM3 and the first power wiring PW11. In some embodiments, the first through via TV1 may be omitted.

In some embodiments, a via insulating film 196 extending along the side surfaces of the first super via pattern SV1 may be formed. The via insulating film 196 may include an insulating substance or material for electrically insulating the first super via pattern SV1 from the substrate 100. The via insulating film 196 may include, for example, but is not limited to, at least one of silicon oxide ($SiO_2$), silicon oxynitride (SiON), silicon oxycarbonitride (SiOCN) or a combination thereof.

Figure 16:
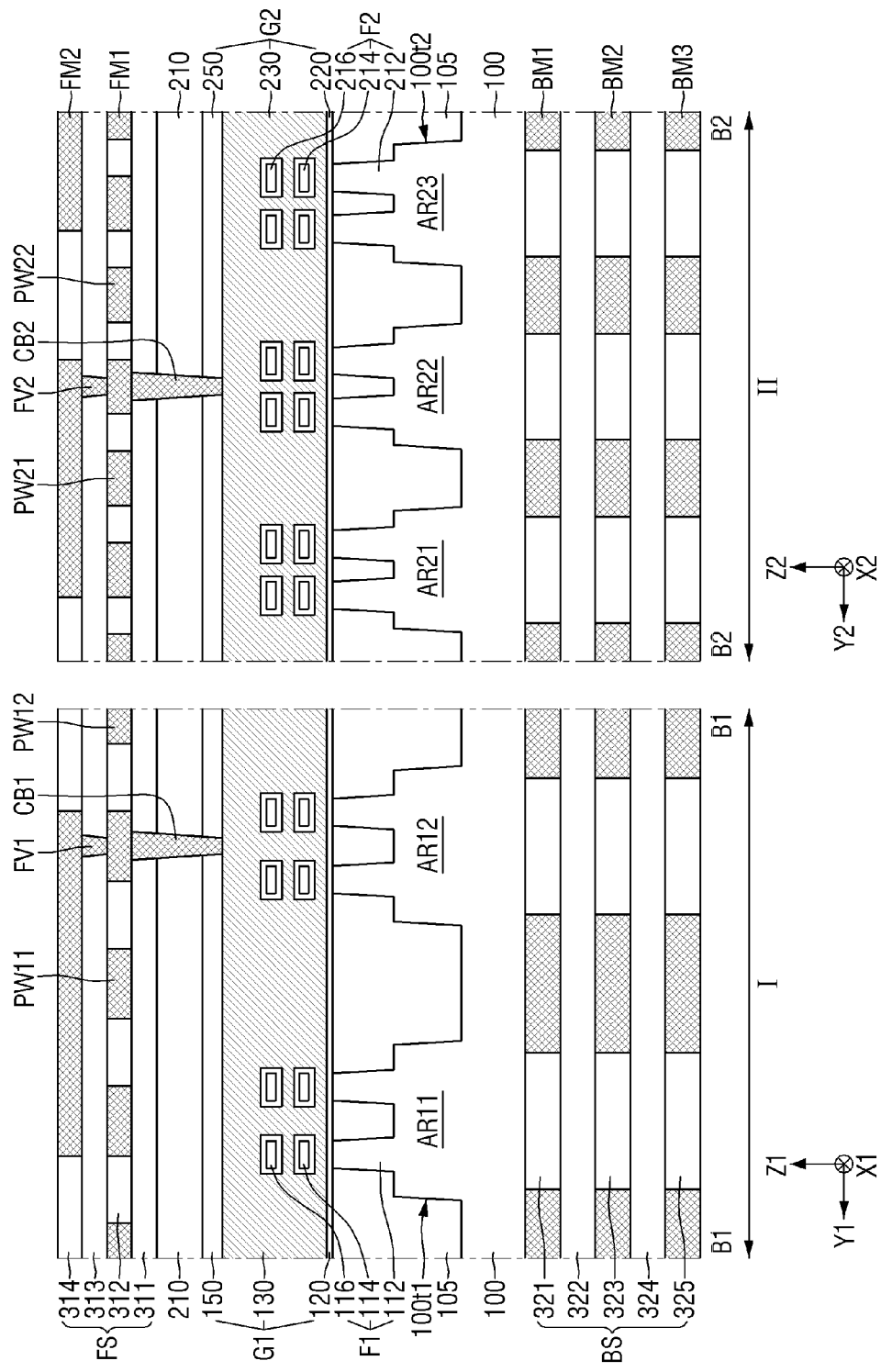
FIGS. 16 and 17 are cross-sectional views for explaining a semiconductor device according to some embodiments.
Figure 17:
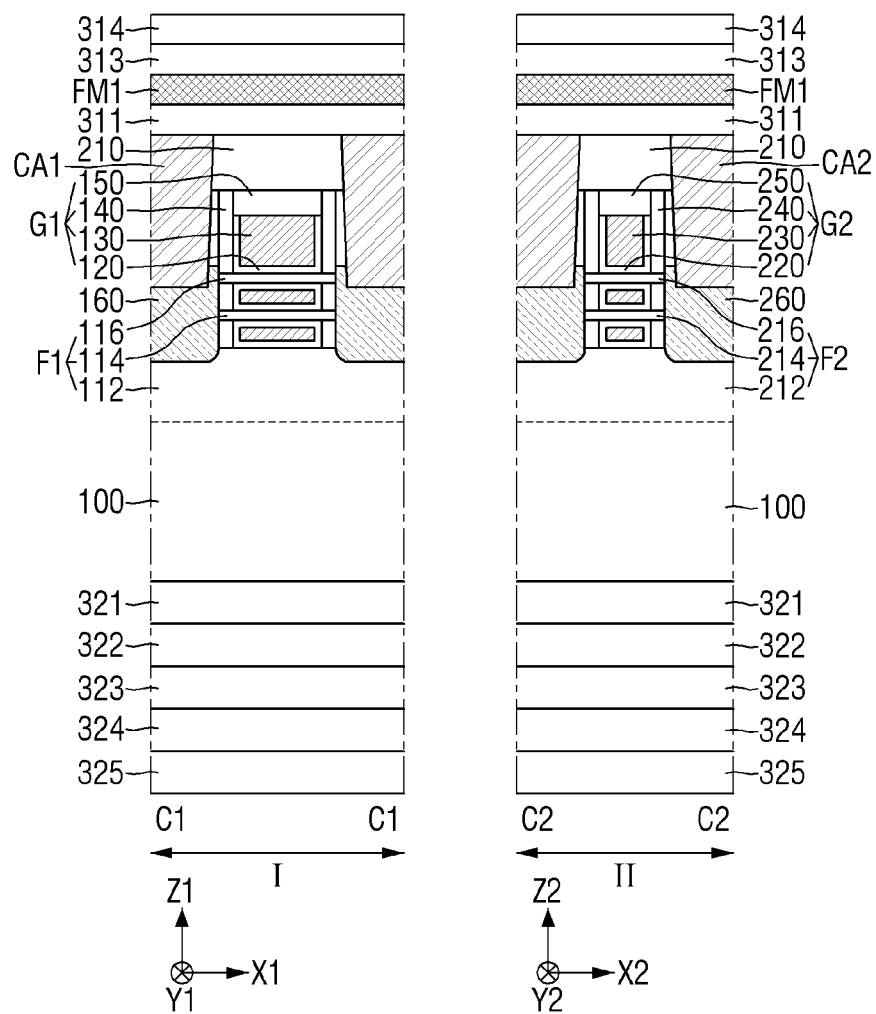

FIGS. 16 and 17 are cross-sectional views for explaining a semiconductor device according to some embodiments. For convenience of explanation, repeated parts of contents explained above using FIGS. 1 to 5 will be briefly explained or omitted. For reference, FIG. 16 is another cross-sectional view taken along B1-B1 and B2-B2 of FIG. 1, and FIG. 17 is another cross-sectional view taken along C1-C1 and C2-C2 of FIG. 1.

Referring to FIGS. 16 and 17, in the semiconductor device according to some embodiments, the active patterns F1 and F2 each include a plurality of wire patterns.

For example, the first active pattern F1 may include first and second wire patterns 114 and 116 that are sequentially stacked on the upper side of the substrate 100 and spaced apart from each other. As an example, the first wire pattern 114 may be spaced apart from the substrate 100 in a fifth direction Z1, and the second wire pattern 116 may be spaced apart from the first wire pattern 114 in the fifth direction Z1. The first and second wire patterns 114 and 116 may each extend in the first direction X1 and penetrate the first gate structure G1. That is, the first gate structure G1 may surround each of the first and second wire patterns 114 and 116.

Further, for example, the second active pattern F2 may include third and fourth wire patterns 214 and 216 that are sequentially stacked on the upper side of the substrate 100 and spaced apart from each other. As an example, the third wire pattern 214 may be spaced apart from the substrate 100 in a sixth direction Z2, and the fourth wire pattern 216 may be spaced apart from the third wire pattern 214 in the sixth direction Z2. The third and fourth wire patterns 214 and 216 may each extend in the second direction X2 and penetrate the second gate structure G2. That is, the second gate structure G2 may surround each of the third and fourth wire patterns 214 and 216.

Although FIG. 16 only shows that the cross sections of the wire patterns 114, 116, 214 and 216 have a rectangular shape, this is only by way of example. As another example, the cross sections of the wire pattern 114, 116, 214 and 216 may be circular or other polygonal, respectively.

In some embodiments, the first active pattern F1 may further include a first fin type pattern 112 that protrudes from the upper side of the substrate 100 and extends in the first direction X1. The first wire pattern 114 may be, for example, spaced apart from the first fin type pattern 112 in the fifth direction Z1. In some embodiments, the second active pattern F2 may further include a second fin type pattern 212 that protrudes from the upper side of the substrate 100 and extends in the second direction X2. The third wire pattern 214 may be, for example, spaced apart from the second fin type pattern 212 in the sixth direction Z2.

Figure 18:
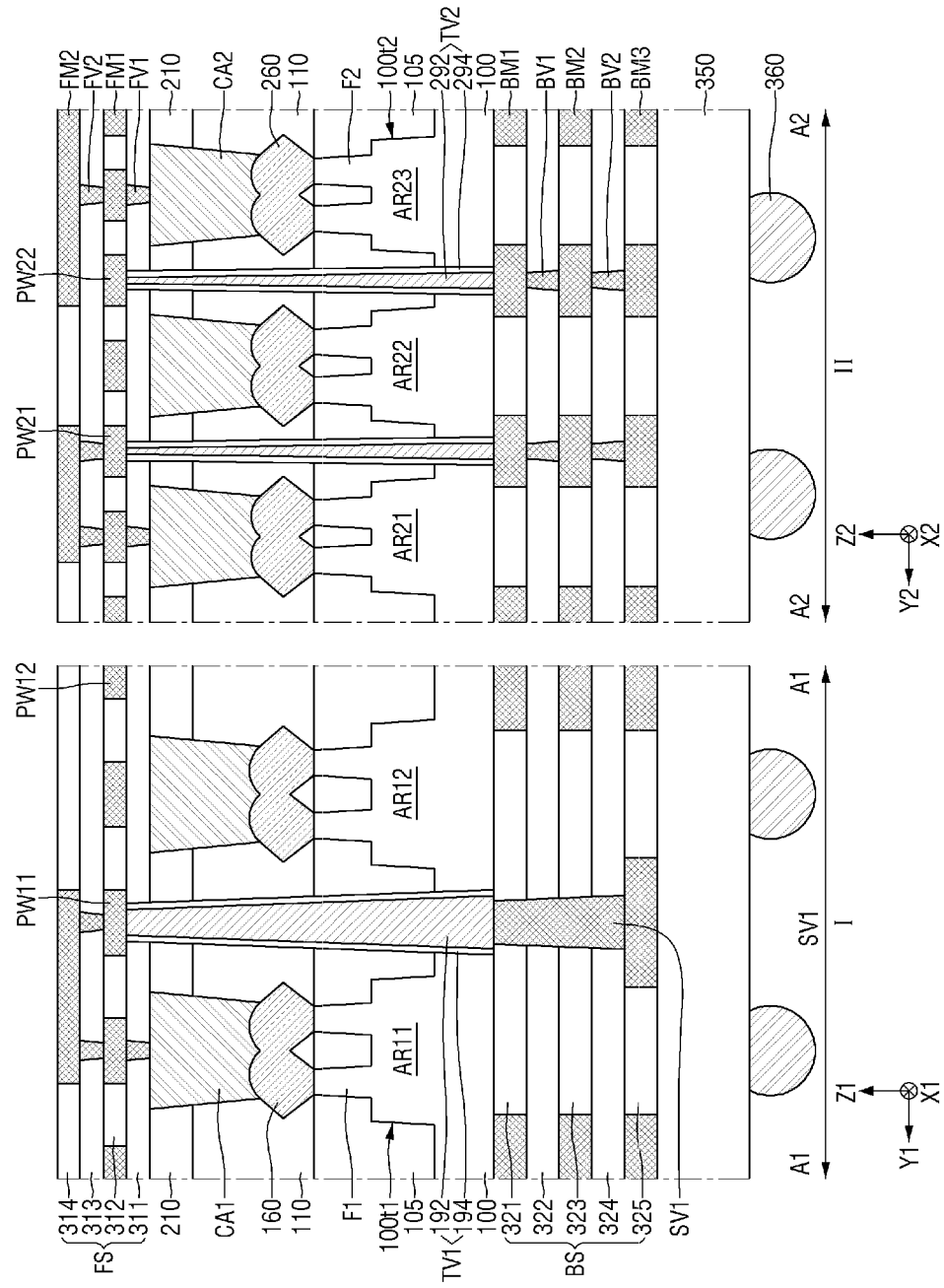
FIG. 18 is a cross-sectional view for explaining a semiconductor device according to some embodiments.

FIG. 18 is a cross-sectional view for explaining a semiconductor device according to some embodiments. For convenience of explanation, repeated parts of contents explained above using FIGS. 1 to 5 will be briefly explained or omitted. For reference, FIG. 18 is another cross-sectional view taken along A1-A1 and A2-A2 of FIG. 1.

Referring to FIG. 18, the semiconductor device according to some embodiments further includes a redistribution layer 350 and a pad 360.

The redistribution layer 350 may be formed on the lower side of the backside wiring structure BS. The redistribution layer 350 may be electrically connected to the backside wiring structure BS. For example, the redistribution layer 350 may include a polymer layer, and wiring patterns of multiple layers that are electrically connected to the third backside wiring pattern BM3 inside the polymer layer.

The pad 360 may be formed on the lower side of the redistribution layer 350. The pad 360 may be exposed from the redistribution layer 350 and supplied with signals (e.g., data signal or power signal) from outside. The pad 360 may be electrically connected to the redistribution layer 350. The backside wiring structure BS may form a power delivery network (PDN) of the semiconductor device according to some embodiments accordingly.

Hereinafter, a method for fabricating a semiconductor device according to exemplary embodiments will be described referring to FIGS. 1 to 5 and 19 to 30.

Figure 19:
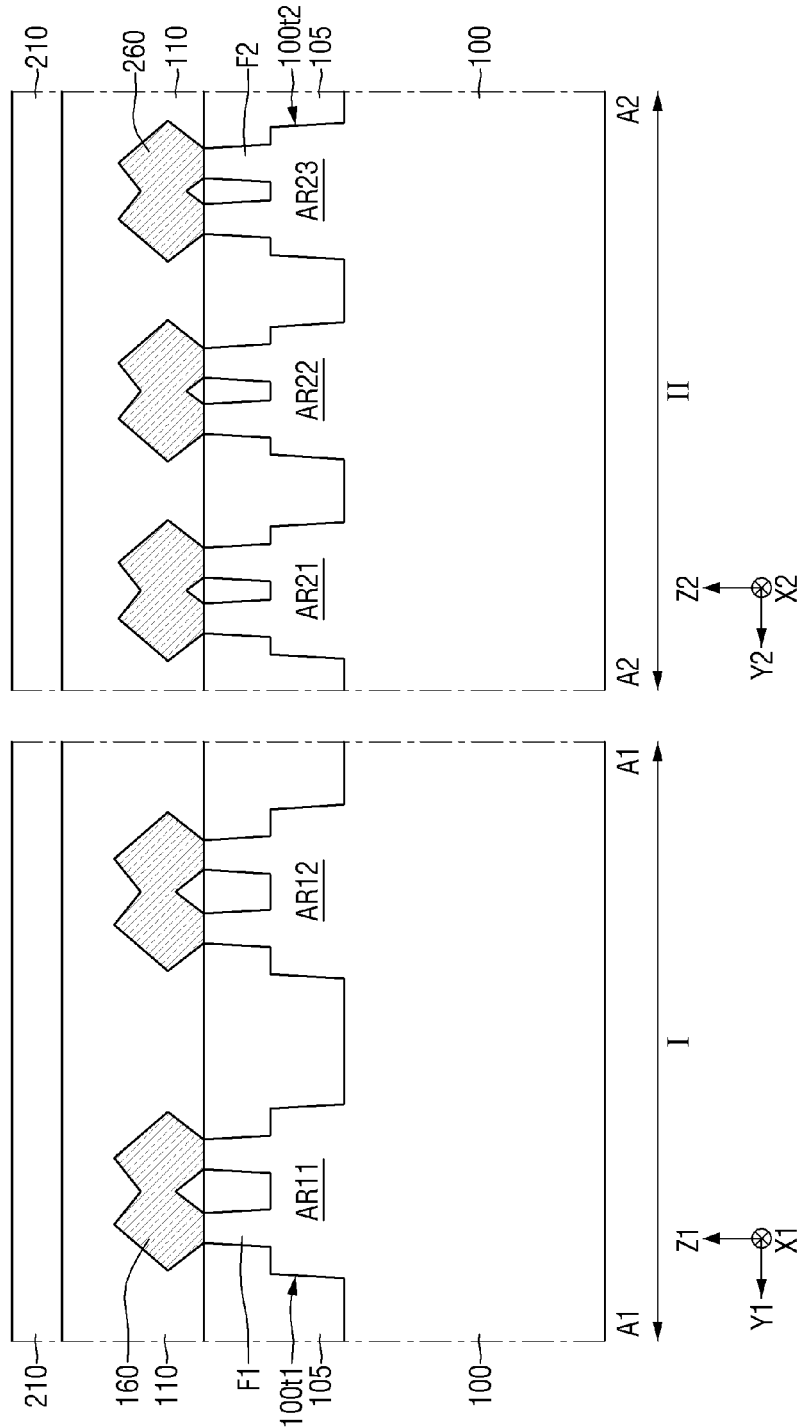
FIGS. 19, 20, 21, 22, 23, 24, 25, 26, 27, 28, 29, and 30 are intermediate diagrams for explaining a method for fabricating the semiconductor device according to some embodiments.
Figure 20:
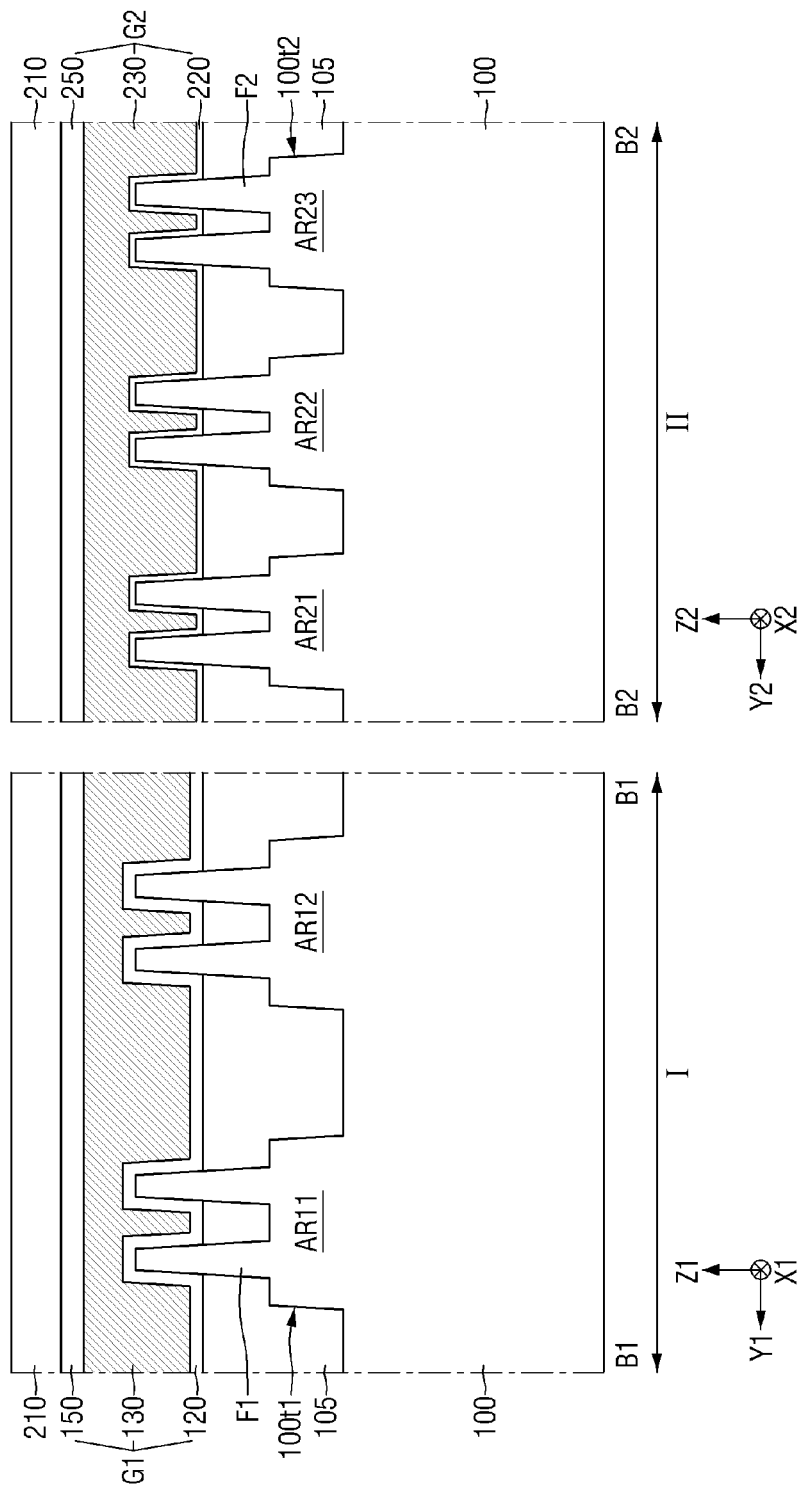
Figure 21:
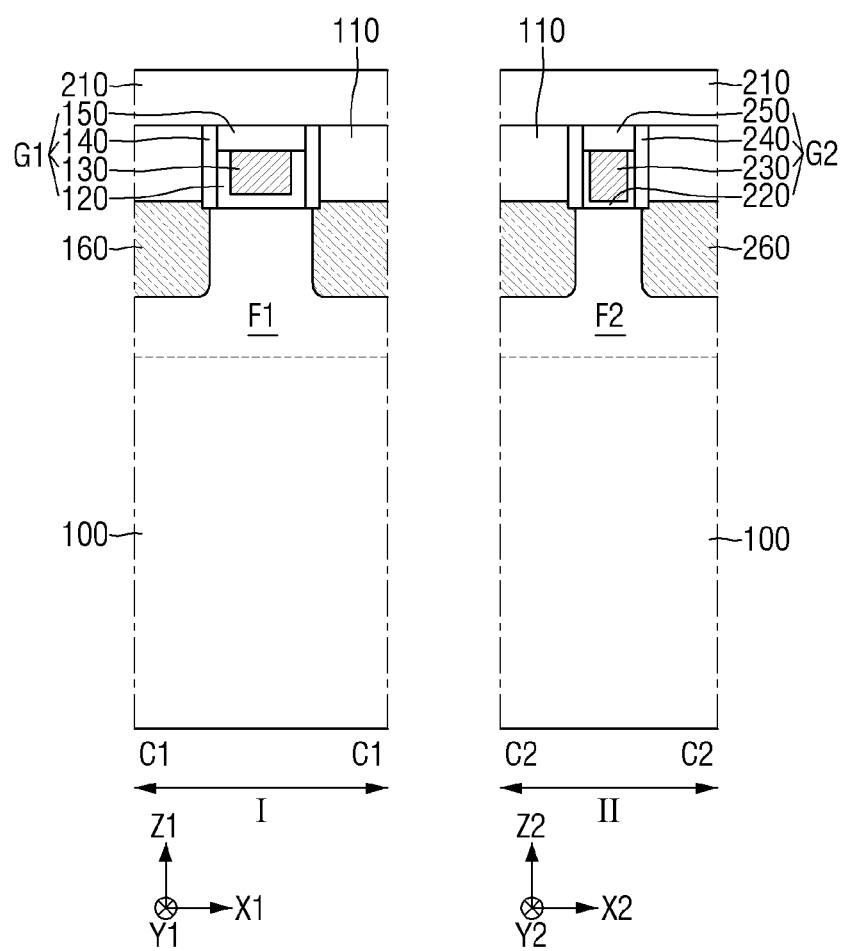
Figure 22:
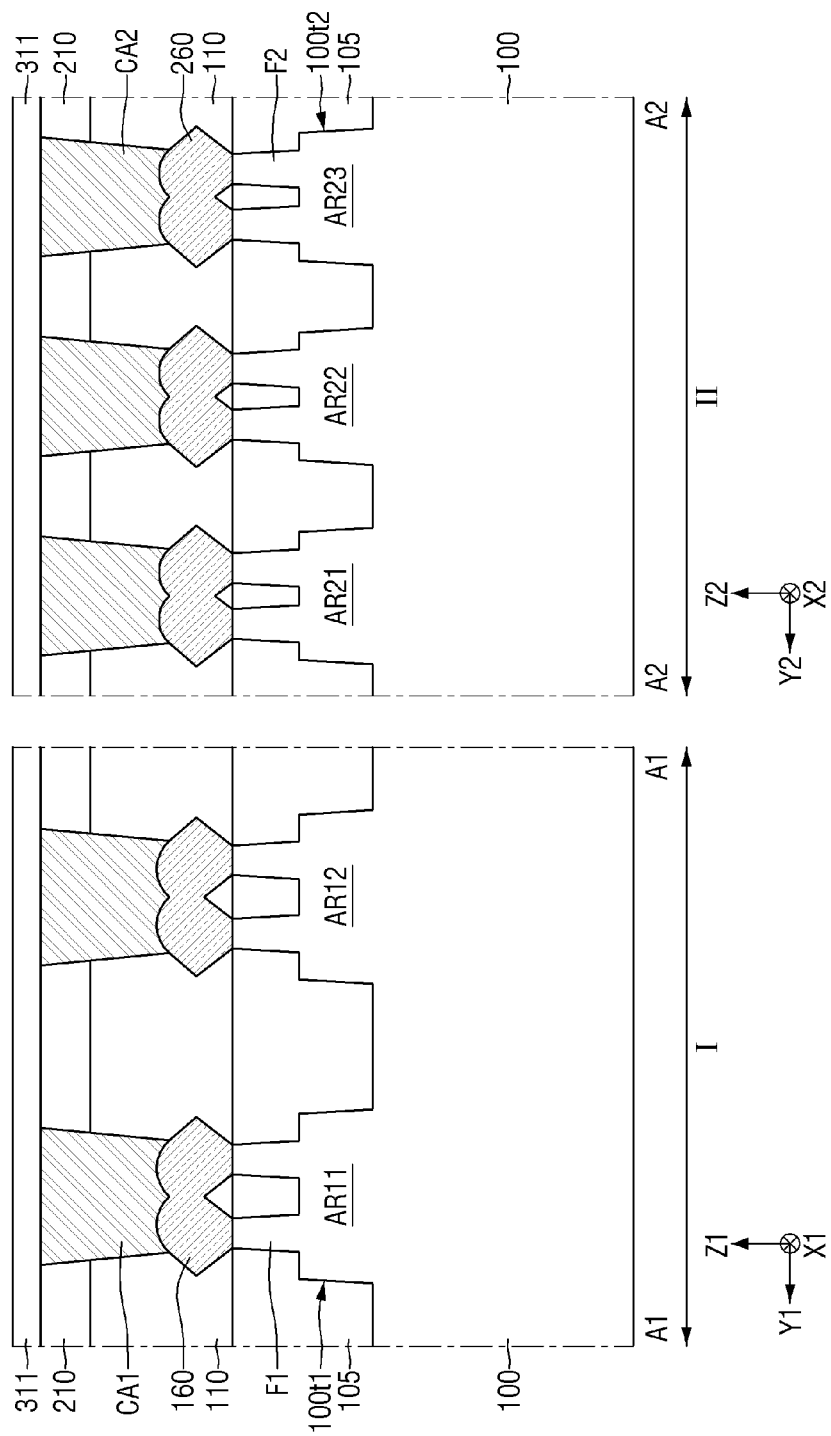
Figure 23:
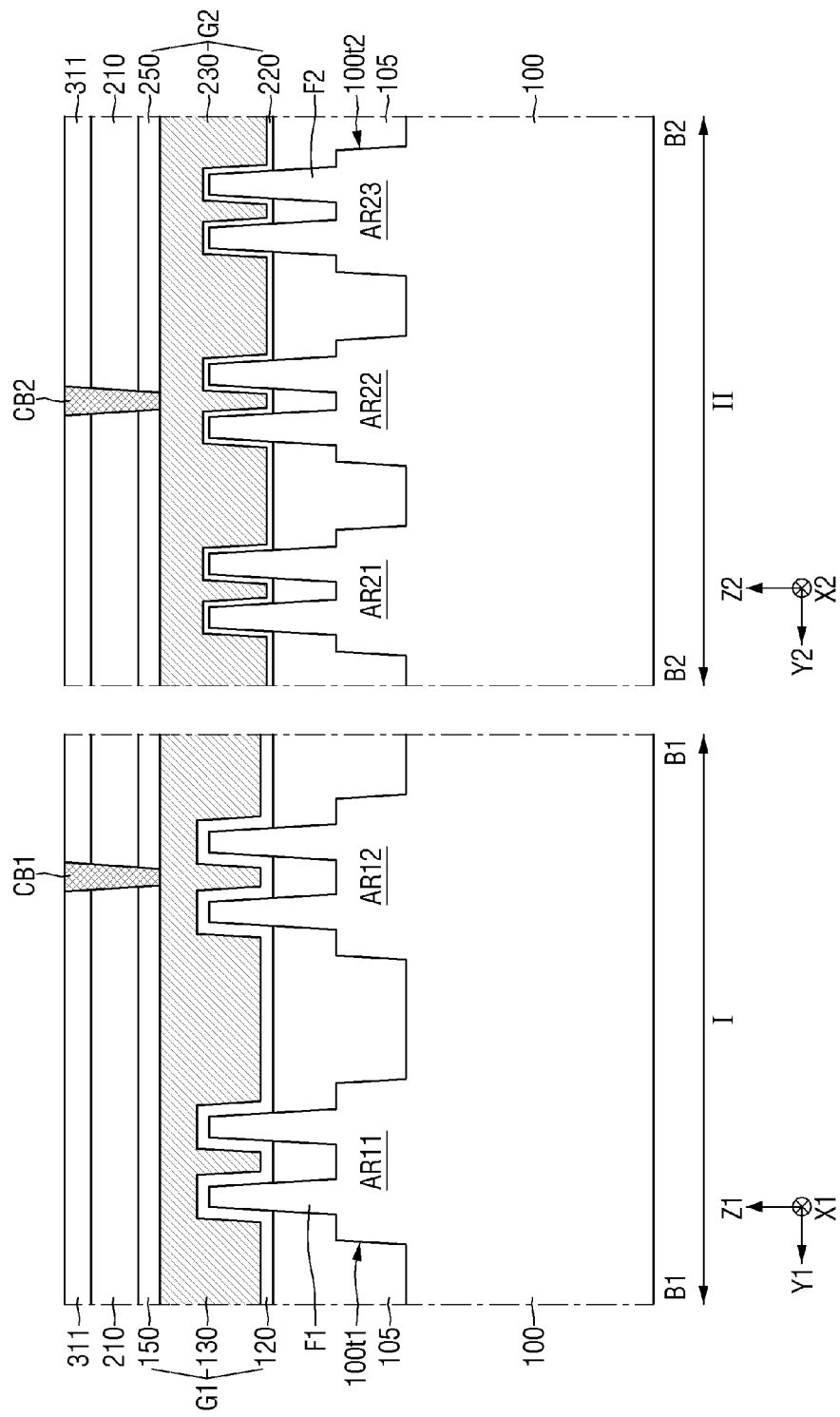
Figure 24:
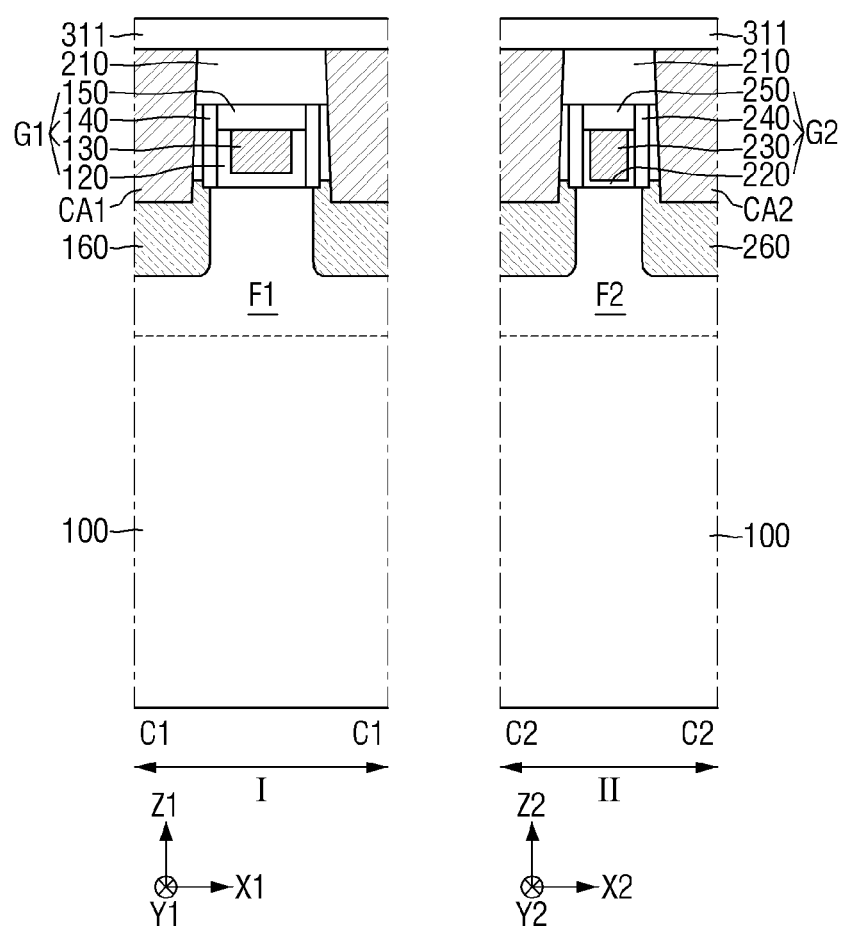

FIGS. 19 to 30 are intermediate stage diagrams for explaining the method for fabricating the semiconductor device according to some embodiments. For convenience of explanation, repeated parts of contents explained above using FIGS. 1 to 5 will be briefly explained or omitted. For reference, FIGS. 19, 22, and 25 to 30 are cross-sectional views taken along A1-A1 and A2-A2 of FIG. 1, respectively. FIGS. 20 and 23 are cross-sectional views taken along B1-B1 and B2-B2 of FIG. 1, respectively. FIGS. 21 and 24 are cross-sectional views taken along C1-C1 and C2-C2 of FIG. 1, respectively.

Referring to FIGS. 19 to 21, electronic elements (for example, the first electronic element TR1 and the second electronic element TR2 of FIG. 1) are formed on the frontside of the substrate 100 (for example, the upper side of the substrate 100).

For example, the first and second active regions AR11 and AR12 may be formed inside the first region I, and the third to fifth active regions AR21 to AR23 may be formed inside the second region II. The first and second active regions AR11 and AR12 may be defined by the first element separation trenches 100t1 inside the substrate 100, and the third to fifth active regions AR21 to AR23 may be defined by the second element separation trenches 100t2 inside the substrate 100.

Subsequently, the first active pattern F1, the first gate structure G1 and the first source/drain region 160 may be formed on the first and second active regions AR11 and AR12. Further, the second active pattern F2, the second gate structure G2, and the second source/drain region 260 may be formed on the third to fifth active regions AR21 to AR23.

Subsequently, interlayer insulating films 110 and 210 that cover the electronic elements (for example, the first electronic element TR1 and the second electronic element TR2 of FIG. 1) may be formed. The interlayer insulating films 110 and 210 may cover the first active pattern F1, the first gate structure G1, the first source/drain region 160, the second active pattern F2, the second gate structure G2 and the second source/drain region 260.

Referring to FIGS. 22 to 24, the first source/drain contact CA1, the second source/drain contact CA2, the first gate contact CB1 and the second gate contact CB2 are formed.

For example, the first source/drain contact CA1 that penetrates the interlayer insulating films 110 and 210 and is connected to the first source/drain region 160 may be formed. Further, the second source/drain contact CA2 that penetrates the interlayer insulating films 110 and 210 and is connected to the second source/drain region 260 may be formed.

Subsequently, the first frontside inter-wiring insulating film 311 that covers the interlayer insulating films 110 and 210, the first source/drain contact CA1 and the second source/drain contact CA2 may be formed. The first gate contact CB1 may penetrate the first frontside inter-wiring insulating film 311, the interlayer insulating films 110 and 210, and the first gate capping pattern 150, and may be connected to the first gate electrode 130. Further, the second gate contact CB2 may penetrate the first frontside inter-wiring insulating film 311, the interlayer insulating films 110 and 210, and the second gate capping pattern 250, and may be connected to the second gate electrode 230.

Figure 25:
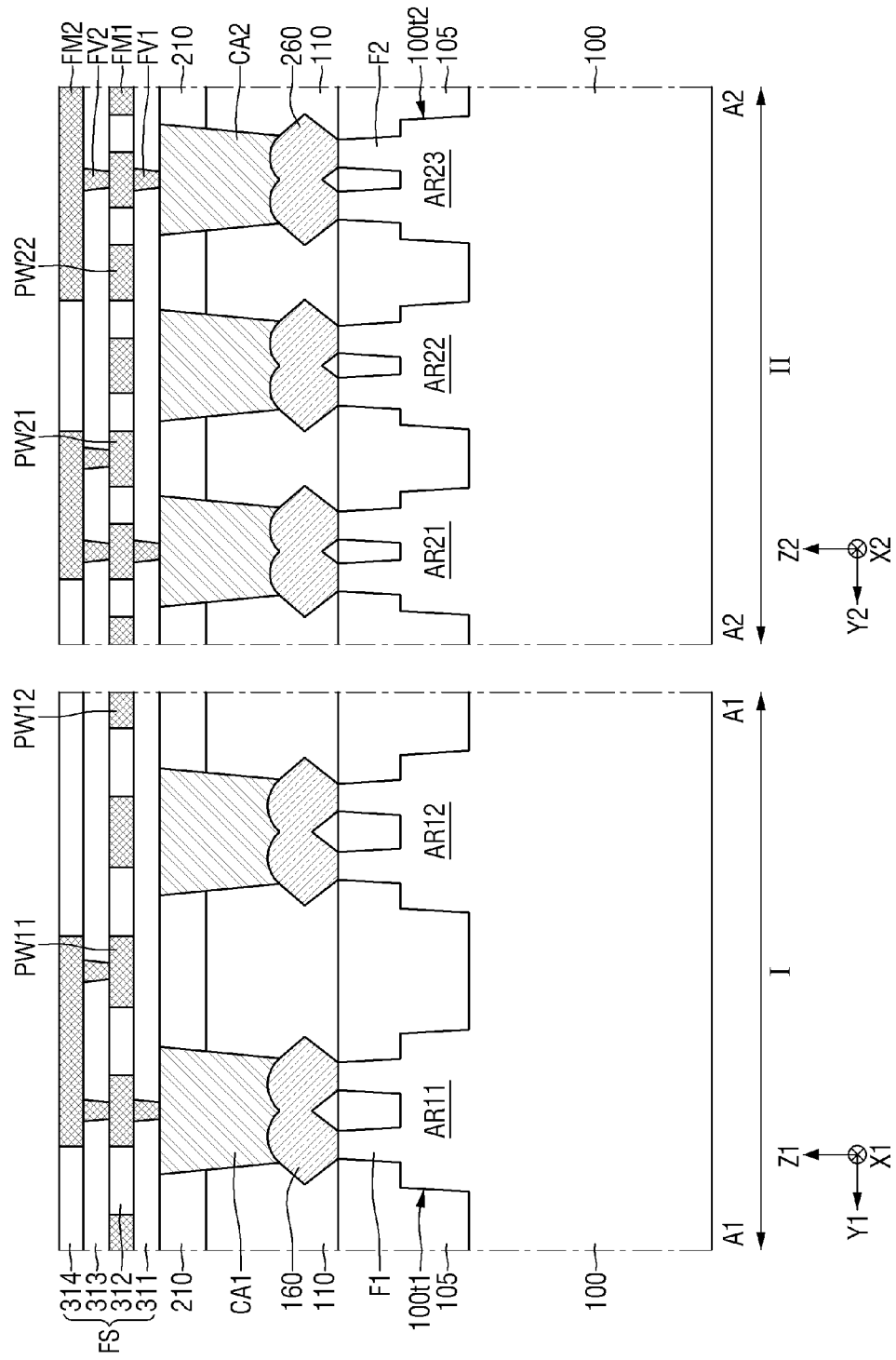

Referring to FIG. 25, a frontside wiring structure FS is formed on the upper sides of the interlayer insulating films 110 and 210.

For example, the first to fourth frontside inter-wiring insulating films 311 to 314, the first and second frontside wiring patterns FM1 and FM2, and the first and second frontside via patterns FV1 and FV2 may be formed on the upper sides of the interlayer insulating films 110 and 210. The frontside wiring structure FS may provide a signal line and a power line for various electronic elements (for example, the first electronic element TR1 and the second electronic element TR2 of FIG. 1) formed on the frontside of the substrate 100.

In some embodiments, power wirings PW11, PW12, PW21 and PW22 placed at the same level as a part of the frontside wiring patterns FM1 and FM2 may be formed. As an example, the power wirings PW11, PW12, PW21 and PW22 may be placed at the same level as the first frontside wiring pattern FM1.

Figure 26:
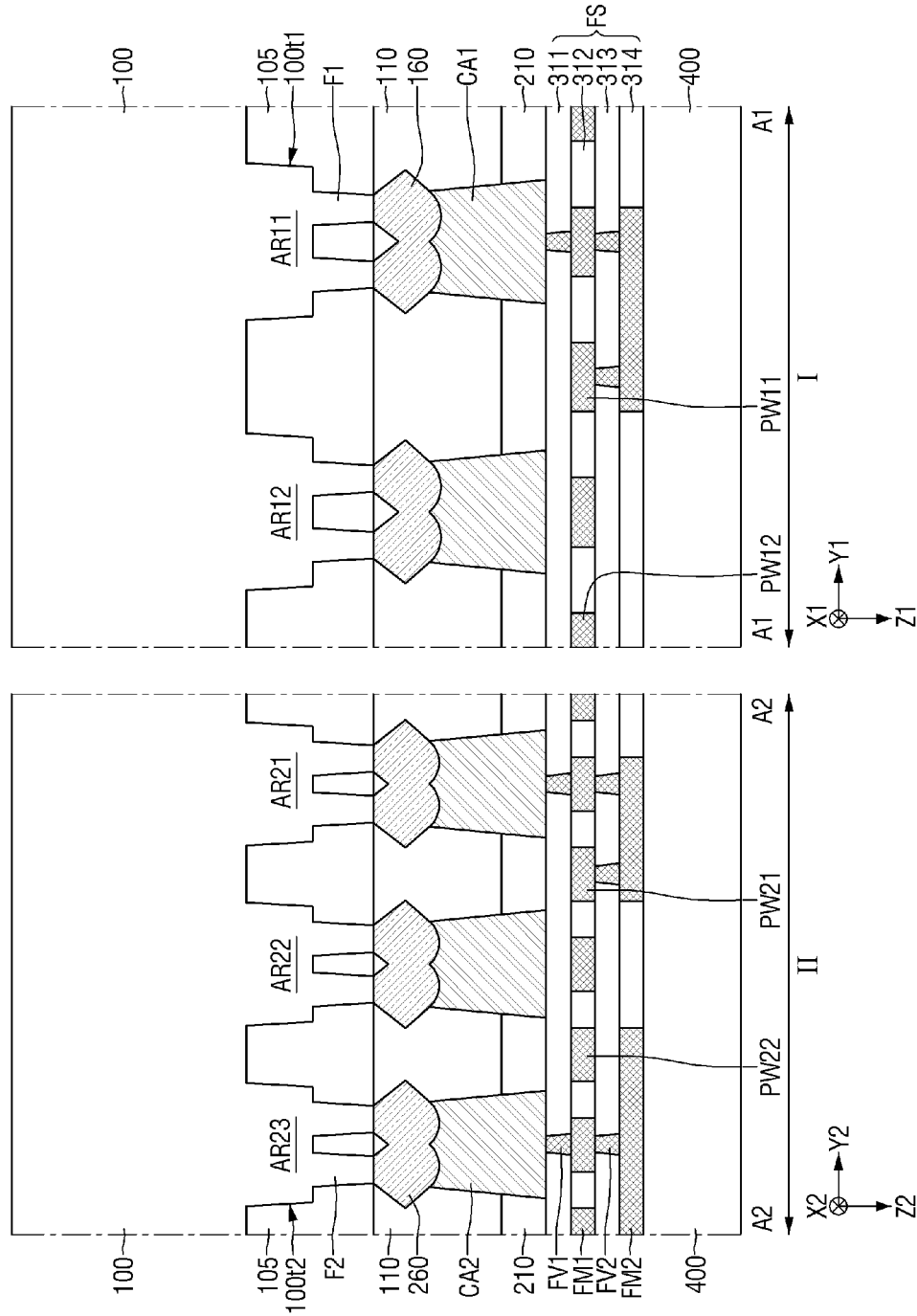

Referring to FIG. 26, a carrier substrate 400 is attached onto the frontside wiring structure FS.

For example, the carrier substrate 400 may be attached onto the fourth frontside inter-wiring insulating film 314. The carrier substrate 400 may function as a support substrate that supports the semiconductor device to which the carrier substrate 400 is attached in a subsequent process. After the carrier substrate 400 is attached, the substrate 100 may be inverted so that a backside thereof faces upward.

Figure 27:
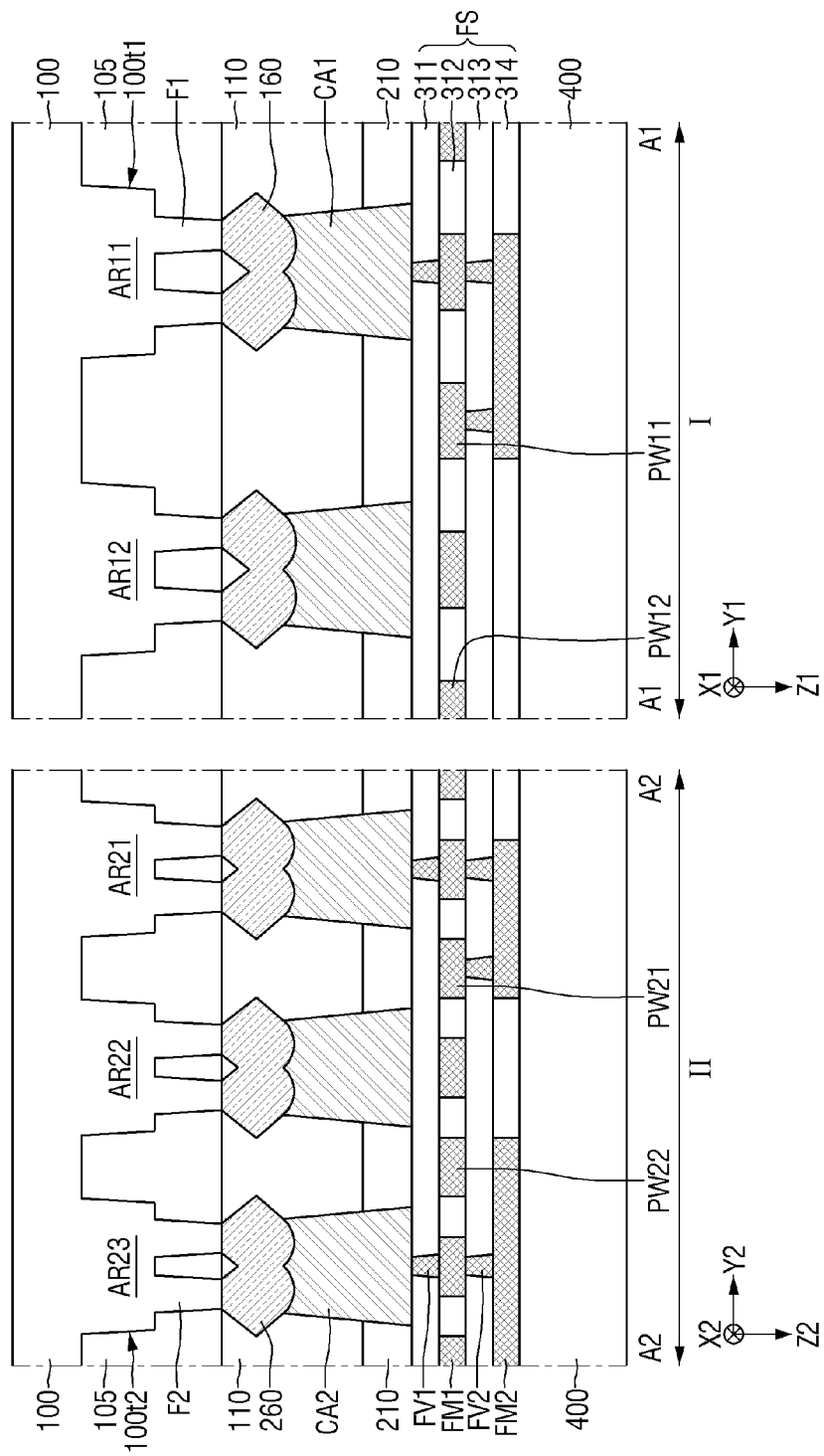

Referring to FIG. 27, a thinning process is performed on the backside of the substrate 100.

For example, a back grinding process may be performed on the backside of the substrate 100. Accordingly, the thickness of the substrate 100 may decrease and get thinner.

Figure 28:
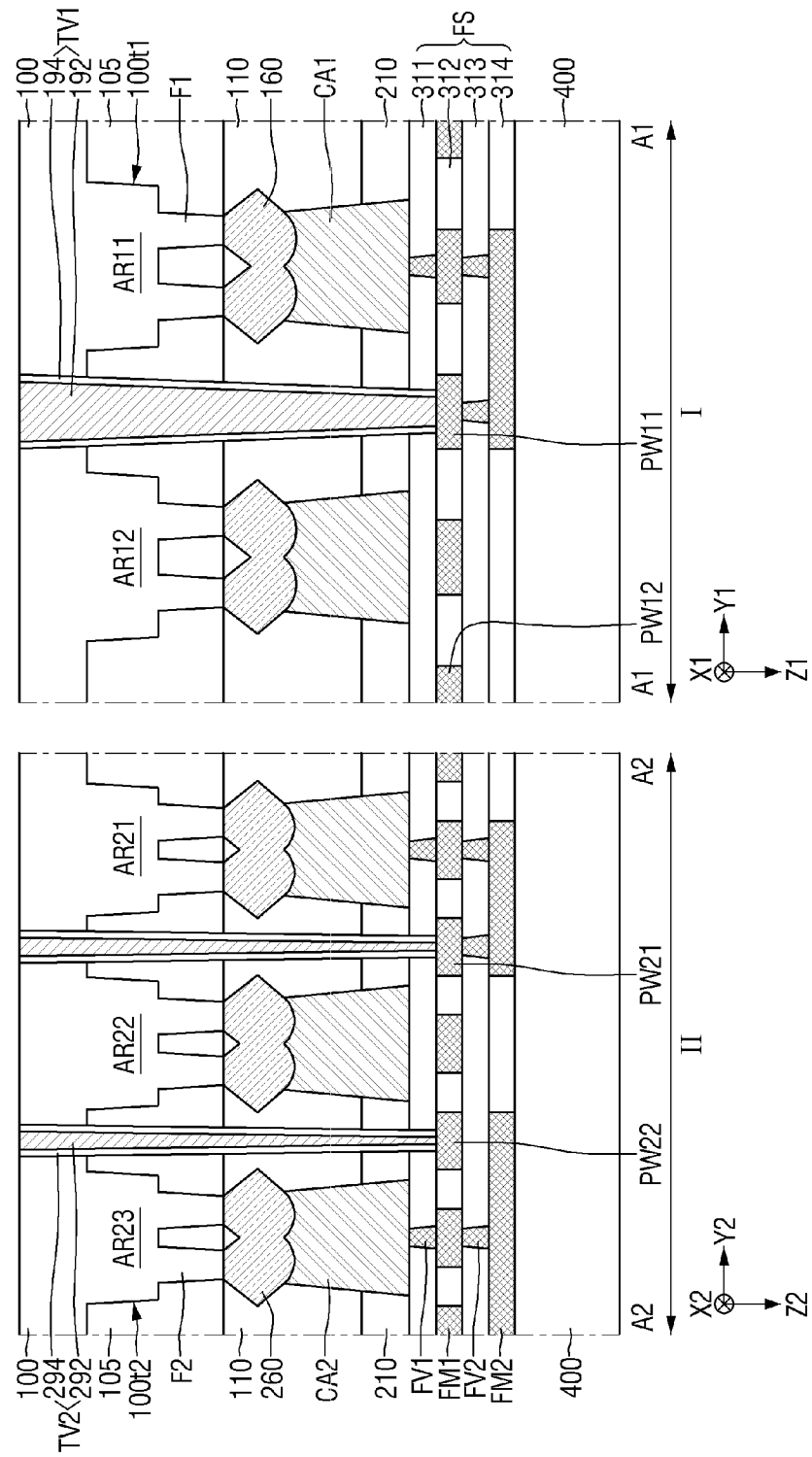

Referring to FIG. 28, the first through via TV1 and the second through via TV2 which are connected to the frontside wiring structure FS are formed.

For example, the first through via TV1 which penetrates the substrate 100, the field insulating film 105, the interlayer insulating films 110 and 210 and the first frontside wiring insulating film 311 and is connected to the first power wiring PW11 may be formed. Further, the second through via TV2 which penetrates the substrate 100, the field insulating film 105, the interlayer insulating films 110 and 210 and the first frontside wiring insulating film 311, and is connected to the third power wiring PW21 and/or the fourth power wiring PW22 may be formed.

In some embodiments, the first through via TV1 and the second through via TV2 may include through conductive films 192 and 292 and through insulating films 194 and 294, respectively.

Figure 29:
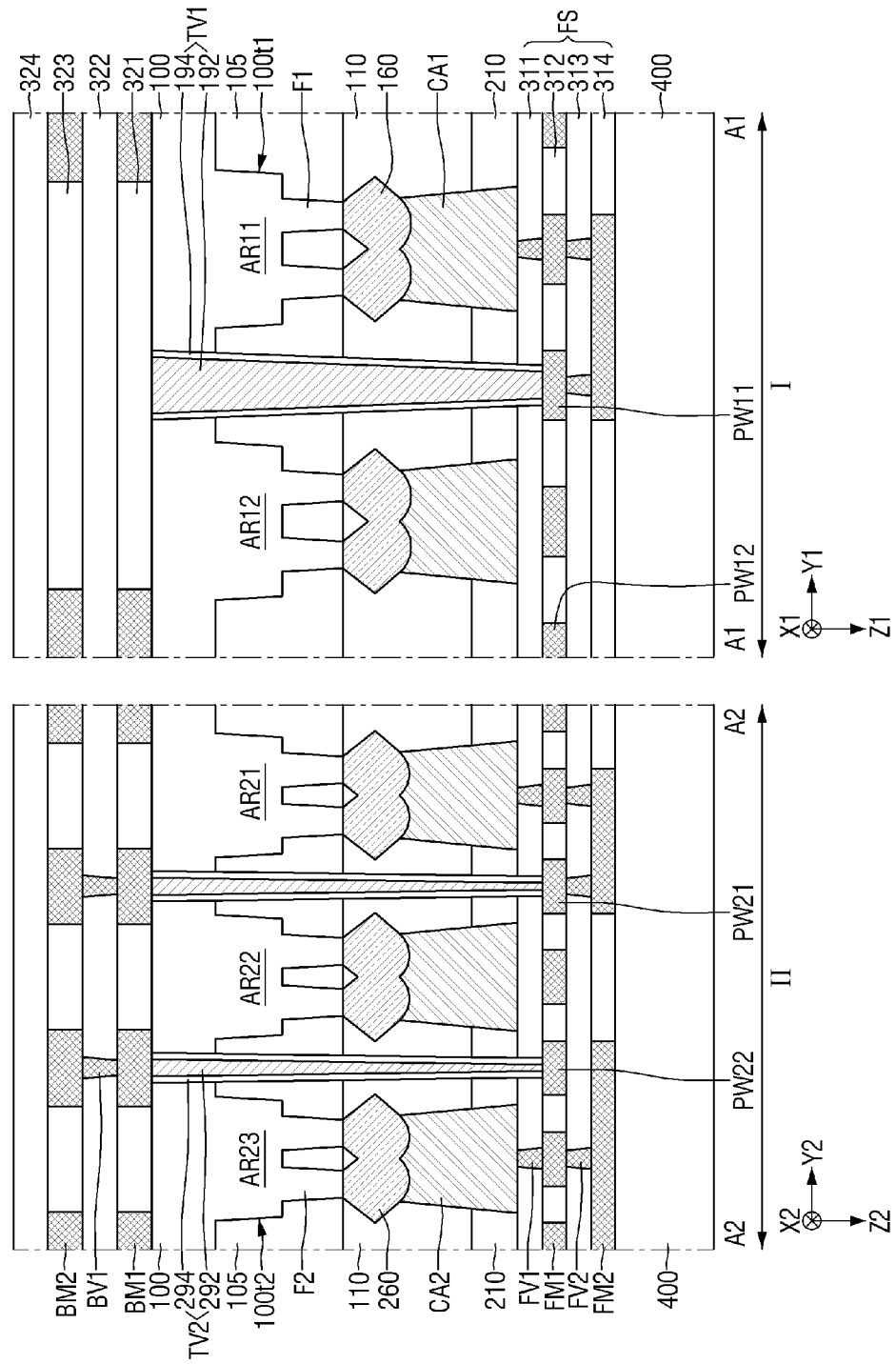

Referring to FIG. 29, a part of the backside wiring structure BS is formed on the backside of the substrate 100.

For example, the first to fourth backside inter-wiring insulating films 321 to 324, the first and second backside wiring patterns BM1 and BM2, and the first backside via pattern BV1 may be formed on the backside of the substrate 100.

A part of the formed backside wiring structure BS may be connected to the first through via TV1 and the second through via TV2. Accordingly, the backside wiring structure BS may provide signal lines and power wirings for various electronic elements (for example, the first electronic element TR1 and the second electronic element TR2 of FIG. 1) formed on the frontside of the substrate 100.

Figure 30:
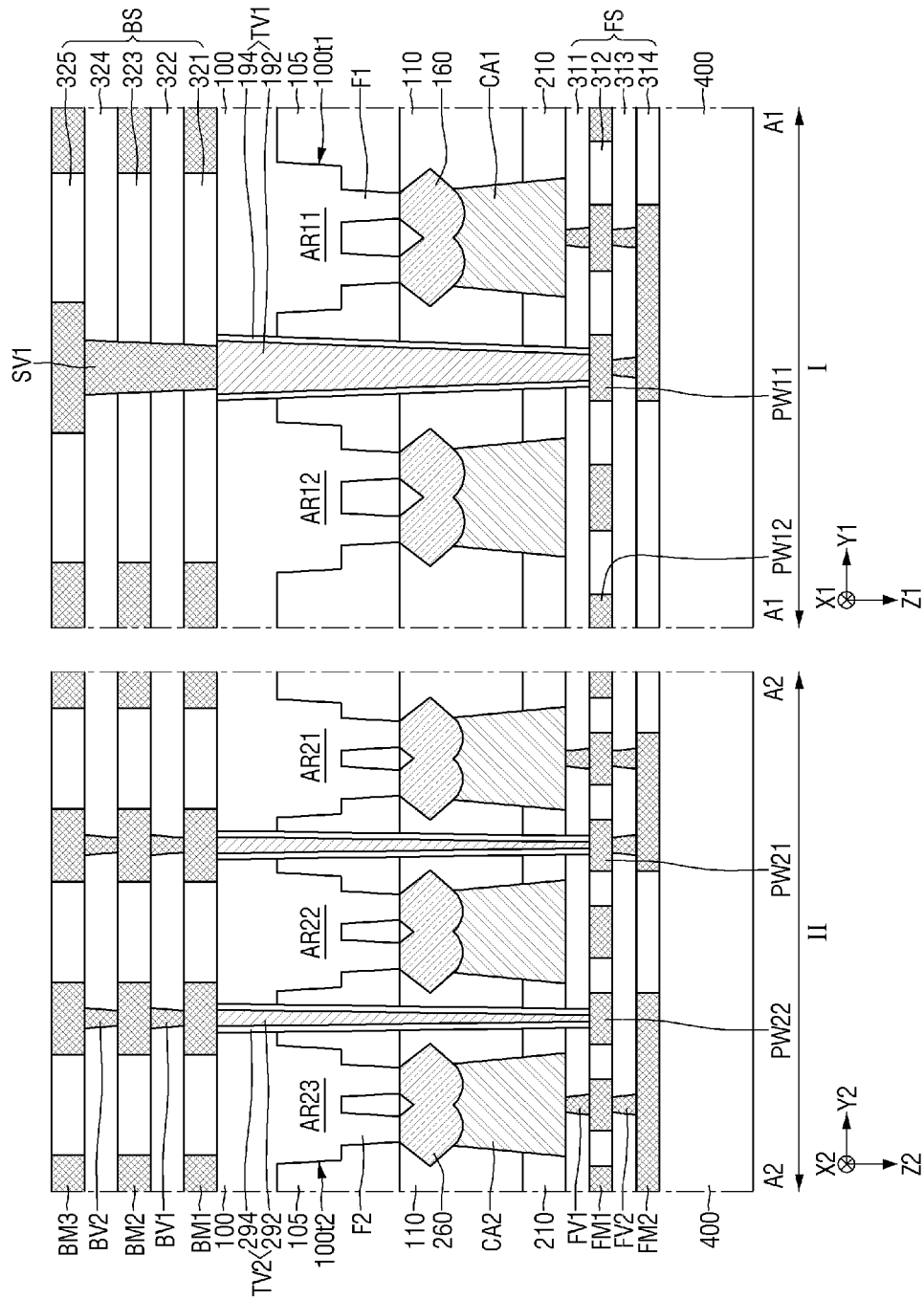

Referring to FIG. 30, the remaining part of the backside wiring structure BS is formed on the backside of the substrate 100.

For example, the first super via pattern SV1, the second backside via pattern BV2, the fifth backside inter-wiring insulating film 325, and the third backside wiring pattern BM3 may be formed.

The first super via pattern SV1 may be formed to penetrate the plurality of backside inter-wiring insulating films among the backside inter-wiring insulating films 321 to 325. As an example, the first super via pattern SV1 may penetrate the first to fourth backside inter-wiring insulating films 321 to 324 and may be connected to the first through via TV1.

The second backside via pattern BV2 may be formed to penetrate the fourth backside inter-wiring insulating film 324 and be connected to the second backside wiring pattern BM2. The fifth backside inter-wiring insulating film 325 may be formed to cover the fourth backside inter-wiring insulating film 324. The third backside wiring pattern BM3 is formed inside the fifth backside inter-wiring insulating film 325, and may be formed to be connected to the first super via pattern SV1 and the second backside via pattern BV2.

Subsequently, the carrier substrate 400 is removed. After the carrier substrate 400 is removed, the substrate 100 may be inverted so that a frontside thereof faces upward. Accordingly, the semiconductor device explained above using FIGS. 1 to 5 may be fabricated.

In concluding the detailed description, those skilled in the art will appreciate that many variations and modifications may be made to the preferred embodiments without substantially departing from the principles of the present invention. Therefore, the disclosed embodiments of the invention are used in a generic and descriptive sense only and not for purposes of limitation.

What is claimed is:

1. A semiconductor device comprising:
   a substrate comprising a frontside including an active region, and a backside opposite to the frontside;
   an electronic element on the active region;
   a frontside wiring structure electrically connected to the electronic element, on the frontside of the substrate; and
   a backside wiring structure electrically connected to the electronic element, on the backside of the substrate,
   wherein the backside wiring structure comprises a plurality of backside wiring patterns sequentially stacked on the backside of the substrate, and a super via pattern that intersects and extends through at least one layer of the plurality of backside wiring patterns,
   wherein the super via pattern does not penetrate the substrate.

2. The semiconductor device of claim 1, wherein the backside wiring structure further comprises a plurality of backside inter-wiring insulating films that are sequentially stacked on the backside of the substrate and have the plurality of backside wiring patterns thereon or therein, and the super via pattern penetrates the plurality of backside inter-wiring insulating films and electrically connects the plurality of backside wiring patterns.

3. The semiconductor device of claim 1, wherein a width of the super via pattern decreases toward the backside of the substrate.

4. The semiconductor device of claim 1, wherein the plurality of backside wiring patterns comprise:
   a first backside wiring pattern;
   a second backside wiring pattern that is spaced apart from the backside of the substrate farther than the first backside wiring pattern; and
   a backside via pattern that electrically connects the first backside wiring pattern and the second backside wiring pattern, wherein the backside via pattern is confined between a lower surface of the first backside wiring pattern and an upper surface of the second backside wiring pattern.

5. The semiconductor device of claim 4, wherein a height of the super via pattern is more than about 1.5 times a height of the backside via pattern in a height direction between the frontside and the backside.

6. The semiconductor device of claim 1, wherein the electronic element comprises an active pattern extending in a first direction on the active region, a gate structure extending in a second direction intersecting the first direction on the active pattern, and a source/drain region in the active pattern at sides of the gate structure, and wherein the super via pattern is electrically connected to the source/drain region.

7. The semiconductor device of claim 6, further comprising:
a through via that penetrates the substrate and electrically connects the frontside wiring structure and the super via pattern, wherein the through via is distinct from the super via pattern; and
a source/drain contact that connects the frontside wiring structure and the source/drain region, on the electronic element.

8. The semiconductor device of claim 6, further comprising:
a power wiring in the substrate and connected to the source/drain region; and
a through via that penetrates the substrate and connects the power wiring and the super via pattern, wherein the through via is distinct from the super via pattern.

9. A semiconductor device comprising:
a substrate comprising a first region and a second region;
a first active region and a second active region that are spaced apart by a first distance, in the first region;
a third active region and a fourth active region that are spaced apart by a second distance smaller than the first distance, in the second region;
a first transistor on the first active region;
a second transistor on the third active region;
an interlayer insulating film on the first transistor and the second transistor, on an upper side of the substrate;
a frontside wiring structure electrically connected to the first transistor and the second transistor, on the interlayer insulating film;
a first power wiring electrically connected to the first transistor, between the first active region and the second active region;
a second power wiring electrically connected to the second transistor, between the third active region and the fourth active region; and
a backside wiring structure on a lower side of the substrate,
wherein the backside wiring structure comprises a super via pattern electrically connected to the first power wiring, and a backside via pattern electrically connected to the second power wiring, and
wherein the super via pattern and the backside via pattern do not penetrate the substrate, wherein the super via pattern extends through at least one layer of the backside wiring structure, and wherein a height of the super via pattern is more than about 1.5 times a height of the backside via pattern along a height direction between the upper and lower sides of the substrate.

10. The semiconductor device of claim 9, wherein:
the backside wiring structure comprises a first backside wiring pattern, a second backside wiring pattern, and a plurality of backside inter-wiring insulating films that are stacked on the backside of the substrate;
the super via pattern intersects the first backside wiring pattern and the second backside wiring pattern and extends through two or more of the backside inter-wiring insulating films; and
the backside via pattern electrically connects a lower side of the first backside wiring pattern and an upper side of the second backside wiring pattern and extends through one of the backside inter-wiring insulating films therebetween.

11. The semiconductor device of claim 9, wherein:
the first transistor comprises a first active pattern on the first active region, a first gate structure that intersects the first active pattern on the first active pattern, and a first source/drain region in the first active pattern at sides of the first gate structure;
the second transistor comprises a second active pattern on the third active region, a second gate structure that intersects the second active pattern on the second active pattern, and a second source/drain region in the second active pattern at sides of the second gate structure;
the first power wiring is electrically connected to the first source/drain region, and
the second power wiring is electrically connected to the second source/drain region.

12. The semiconductor device of claim 11, wherein a width of the first gate structure is greater than a width of the second gate structure in a width direction.

13. The semiconductor device of claim 11, wherein:
the first gate structure comprises a first gate electrode that intersects the first active pattern, and a first gate dielectric film between the first gate electrode and the first active pattern;
the second gate structure comprises a second gate electrode that intersects the second active pattern, and a second gate dielectric film between the second gate electrode and the second active pattern; and
a thickness of the first gate dielectric film is greater than a thickness of the second gate dielectric film.

14. The semiconductor device of claim 9, further comprising:
a first through via that penetrates the substrate in the first region and electrically connects the first power wiring and the super via pattern; and
a second through via that penetrates the substrate in the second region and electrically connects the second power wiring and the backside via pattern.

15. The semiconductor device of claim 14, wherein the first power wiring and the second power wiring are in the frontside wiring structure.

16. The semiconductor device of claim 14, wherein the first power wiring and the second power wiring are in the substrate.

17. The semiconductor device of claim 9, wherein the first region is an input/output (I/O) region, and the second region is a core region.

18. A semiconductor device comprising:
a substrate;
an active pattern that extends in a first direction, on an upper side of the substrate;
a gate structure which extends in a second direction intersecting the first direction, on the active pattern;
a source/drain region in the active pattern on a side of the gate structure;
an interlayer insulating film on the active pattern, the gate structure, and the source/drain region;
a power wiring electrically connected to the source/drain region;
a plurality of backside inter-wiring insulating films sequentially stacked on a lower side of the substrate opposite the upper side;
a super via pattern that penetrates the plurality of backside inter-wiring insulating films but does not penetrate the substrate; and a through via that is distinct from the super via pattern and penetrates the substrate and the interlayer insulating film and electrically connects the power wiring and the super via pattern.

19. The semiconductor device of claim 18, further comprising:
a source/drain contact that is spaced apart from the through via, penetrates the interlayer insulating film, and electrically connects the source/drain region and the power wiring.

20. The semiconductor device of claim 18, wherein the active pattern is on an active region that is defined by an element separation trench including the power wiring therein, and the active pattern comprises a fin type pattern that protrudes from the upper side of the substrate and extends in the first direction.

* * * * *